United States Patent [19]
Takemi et al.

[11] Patent Number: 5,805,629
[45] Date of Patent: Sep. 8, 1998

[54] SEMICONDUCTOR LASER

[75] Inventors: Masayoshi Takemi; Tatsuya Kimura; Daisuke Suzuki; Tetsuo Shiba; Kimitaka Shibata, all of Tokyo, Japan

[73] Assignee: Mitsubishi Denki Kabushiki Kaisha, Tokyo, Japan

[21] Appl. No.: 747,050

[22] Filed: Nov. 12, 1996

[30] Foreign Application Priority Data

Dec. 28, 1995 [JP] Japan .................................... 7-343248
Mar. 19, 1996 [JP] Japan .................................... 8-062413

[51] Int. Cl.$^6$ ...................................................... H01S 3/19
[52] U.S. Cl. .............................................................. 372/46
[58] Field of Search ......................................... 372/45, 46

[56] References Cited

U.S. PATENT DOCUMENTS

| 5,390,205 | 2/1995 | Mori et al. | 372/46 |
| 5,561,681 | 10/1996 | Nishimura | 372/46 |
| 5,596,592 | 1/1997 | Tanigami et al. | 372/46 |
| 5,636,237 | 6/1997 | Terakado et al. | 372/46 |

FOREIGN PATENT DOCUMENTS

| 0590870 | 4/1994 | European Pat. Off. . |
| 61-218191 | 9/1986 | Japan . |
| 1281785 | 11/1989 | Japan . |
| 2140987 | 5/1990 | Japan . |
| 4311079 | 11/1992 | Japan . |
| 5267793 | 10/1993 | Japan . |

OTHER PUBLICATIONS

Gotoda et al., "Extremely Smooth Vertical Facets of InP Formed By Reactive Ion Etching And Selective Chemical Beam Epitaxy Regrowth", Journal of Crystal Growth, vol. 145, 1994, pp. 675–679 (No Month).

Ren et al., "Formation Of Narrow, Dry–Etched Mesas For Long Wavelength InP–InGaAsP Lasers", Journal of the Electrochemical Society, vol. 140, No. 11, Nov. 1193, pp. 3284–3289.

"Halbleiter–Technologie", 1984, and explanation of relevance, published by Springer–Verlag, pp. 8–15 and 271–294, (No Month).

Kondo et al., "Buried–Heterostructure Laser Using Dry Etched Mesa Grown By MOVPE", Japan Society of Applied Physics, Extended Abstract 27–ZA–5, p. 930. (No Month or Year).

Y. Ohkura et al., "Low Threshold FS–BH Laser On p–InP Substitute Grown By All–MOCVD", Electronics Letters, vol. 28, No. 19 pp. 1844–1845, Sep. 10, 1992.

B.T. Lee et al., "Fabrication of InGaAsP/InP Buried Heterostructure Laser Using Reactive Ion Etching and Metalorganic Chemical Vapor Deposition", IEE Photonics Tech. Letters, vol. 5, No. 3, Mar. 1993, p. 279–280.

Primary Examiner—James W. Davie
Attorney, Agent, or Firm—Leydig, Voit & Mayer

[57] ABSTRACT

A semiconductor device includes a p type InP substrate with a (001) surface; a mesa structure formed by dry etching, extending along a <110> direction, including semiconductor layers, having ($1\bar{1}0$) side surfaces, and a height $H_m$; and mesa burying layers including a p type InP burying layer on the ($1\bar{1}0$) side surfaces and the (001) surface, the p type InP burying layer having a thickness $D_p$, and an n type InP burying layer on the p type InP burying layer. An angle between a (111)B surface and (001) surface is $\theta_{111}$, the growth rates on the ($1\bar{1}0$) side surfaces and on the (001) surface are respectively $R_g(1\bar{1}0)$ and $R_g(001)$, an angle $\theta$ is $\tan\theta = R_g(1\bar{1}0)/R_g(001)$ and the critical thickness $D_n$ of the n type InP burying layer on the (001) surface when the n type InP burying layer is not grown on the (111)B surface is $$D_n = \frac{H_m - D_p \cdot (1 + \tan\theta_{111})}{1 + \tan\theta \cdot \tan\theta_{111}} = \frac{H_m - (1 + \sqrt{2})D_p}{1 + \sqrt{2}\,\tan\theta}$$

The n type InP burying layer has a thickness $D \leq D_n$. The leakage current path width is narrowed and contact of the n type InP burying layer and an uppermost layer of the semiconductor layers is avoided. Consequently, a semiconductor device having reduced leakage current and superior device characteristics is obtained.

7 Claims, 16 Drawing Sheets

Fig.3 (a) D<Dn
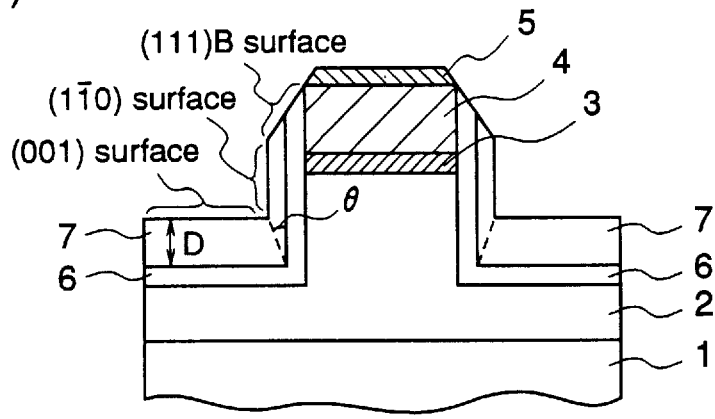
Fig.3 (b) D=Dn
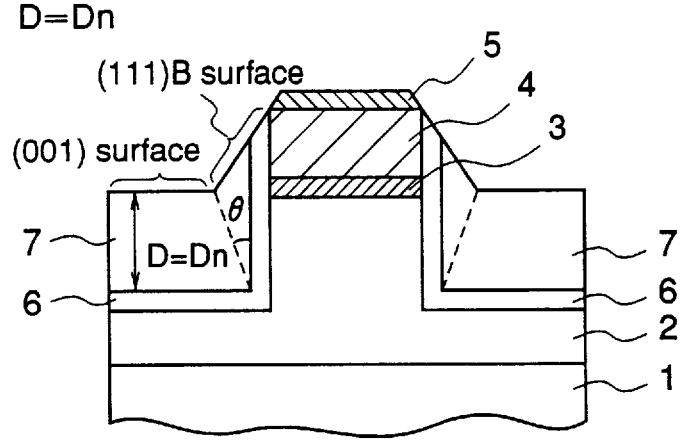
Fig.3 (c) D>Dn
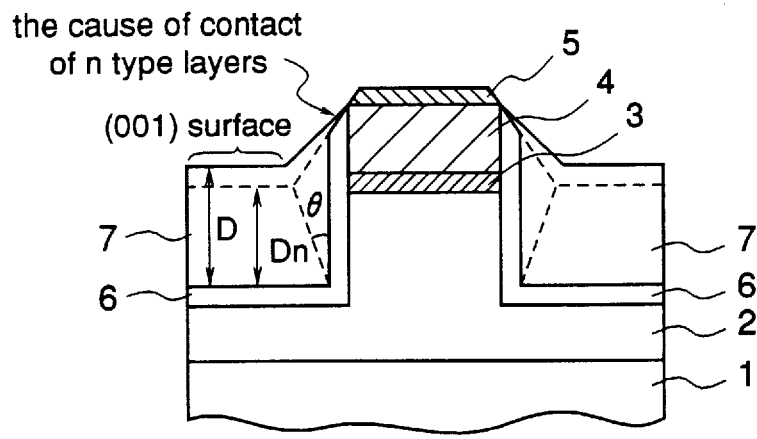

striation width of mesa side surface W (nm)

SEMICONDUCTOR LASER

FIELD OF THE INVENTION

The present invention relates to a semiconductor device and a fabricating method thereof and, more particularly, to a semiconductor laser having a mesa structure formed by dry etching of compound semiconductor grown layers and mesa burying layers, and a fabricating method thereof.

BACKGROUND OF THE INVENTION

Recently, mass data storage and high-speed data transmission have been carried out by optical communication systems. In the future, more mass storage and optical data transmission will be required. When signal conversion from light to electricity or from electricity to light is performed in a signal transmission path, the transmission capacity is considerably limited. In order to settle this problem, without electrical wiring between boards and in each board with an optical device chip, it is necessary to perform signal processing by directly modulating light and to employ optical fibers or optical waveguides for connections between boards and in each board, thereby realizing mass data storage and high-speed data transmission in a reduced module size.

In order to fabricate such an optical waveguide, utilizing a mask that is deposited over a semiconductor substrate, etching is performed to form a mesa structure and the mesa structure is buried with other semiconductor layers. There is MOCVD (metal organic chemical vapor deposition) as a method for burying the mesa with the semiconductor layers. This method employs, for an InGaAsP system material, TMI (trimethylindium) and TEG (triethylgallium) as source materials of In and Ga that are Group III elements, respectively, and $AsH_3$ and $PH_3$ as source materials of As and P that are Group V elements, respectively, and these source materials are thermally decomposed to grow crystals on a substrate. In the InGaAsP system material, a mesa structure including an active layer (InGaAsP layer) that propagates light is buried with InP layers each having a band gap energy larger than that of the active layer.

Generally, wet etching employing a liquid etchant is performed for forming the mesa structure. In this etching, as disclosed in Ohkura et al., Electronics Letters, 28 (1992) pp. 1844–1845, a mask protrudes over the side surfaces of the mesa due to side etching of the mesa, whereby the mesa is successfully buried with the burying layers. In addition, since the mesa side surface is a continuous one, the crystal growth of the burying layers is facilitated.

A description is given of a method of fabricating a prior art semiconductor laser having a mesa structure formed by wet etching as described above. FIGS. 14(a)–14(d) are cross-sectional views illustrating process steps in this fabricating method. Initially, as shown in FIG. 14(a), a p type InP buffer layer 2 having a carrier concentration of $1\times10^{18}$ cm$^{-3}$ and a thickness of 1.8 μm, an undoped 1.3 μm band InGaAsP active layer 3 having a thickness of 0.1 μm, and an n type InP first cladding layer 4 having a carrier concentration of $1\times10^{18}$ cm$^{-3}$ and a thickness of 0.7 μm are successively grown on a p type InP substrate 1 with a (001) surface at the front surface thereof, preferably by MOCVD, to form a double heterojunction structure. Next, an $SiO_2$ film 5 serving as a mask for selective growth and having a width of 5 μm is deposited along a <110> direction, i.e., a direction perpendicular to the cross-section in the figure. Using this $SiO_2$ film 5 as a mask, the grown layers are selectively etched by wet etching using an etchant, such as HBr, to form a mesa structure 20 extending along the <110> direction (FIG. 14(b)). The height of the mesa, i.e., an etching depth, is about 2.5 μm. The width of the mesa is 1.5 μm.

In the step of FIG. 14(c), using the $SiO_2$ film 5 as a mask, a p type InP mesa burying layer 6 having a carrier concentration of $8\times10^{17}$ cm$^{-3}$ and a thickness of 0.7 μm, an n type InP current blocking layer 7 having a carrier concentration of $7\times10^{18}$ cm$^{-3}$ and a thickness of 0.8 μm, and a p type InP current blocking layer 8 having a carrier concentration of $8\times10^{17}$ cm$^{-3}$ and a thickness of 1.0 μm are successively selectively grown on regions of the wafer that are not masked with the $SiO_2$ film 5. In this growth, since the p type InP mesa burying layer 6 has a (111)B surface where no crystal growth proceeds, at adjacent opposite ends of an upper part of the mesa 20 in contact with the $SiO_2$ film 5, the n type InP current blocking layer 7 is not grown on the (111)B surface, so that it does not make contact with the n type InP first cladding layer 4. After removing the $SiO_2$ film 5, an n type InP second cladding layer 9 having a carrier concentration of $1\times10^{18}$ cm$^{-3}$ and a thickness of 1.5 μm and an n type InP contact layer 10 having a carrier concentration of $7\times10^{18}$ cm$^{-3}$ and a thickness of 0.5 μm are successively grown over the entire surface of the wafer.

Finally, a front electrode 11 and a rear electrode 12 are formed on the contact layer 10 and on the rear surface of the substrate 1, respectively (FIG. 14(d)), followed by cleaving of the wafer and coating of front and back facet reflection films, completing the semiconductor laser.

In the semiconductor laser formed on the p type InP substrate, deterioration of laser characteristics depends on the qualities of the mesa burying layers, especially, the space between the active layer 3 and the n type InP current blocking layer 7, i.e., the leakage current path width, and the presence of the contact of the end portion of the n type InP current blocking layer 7 and the n type InP first cladding layer 4. In order to suppress leakage current flowing outside the active layer 3, the leakage current path width shown in FIG. 15 should be as narrow as possible. However, if the width is too narrow, the current flows between the n type InP current blocking layer 7 and the n type InP first cladding layer 4 due to tunneling. Therefore, a leakage current path width of about 0.1–0.2 μm is the most suitable. Meanwhile, when the n type InP cladding layer 4 is in contact with the n type InP current blocking layer 7, current flows into the n type InP current blocking layer 7 through the n type InP contact layer 10 and the n type InP cladding layers 9 and 4 without being concentrated in the active layer 3. As described above, since the p type InP mesa burying layer 6 has the non-growth (111)B surface adjacent opposite ends of an upper part of the mesa 20 in contact with the $SiO_2$ film 5, no n type InP current blocking layer 7 is usually grown on the (111)B surface. However, when the growth of the current blocking layer 7 proceeds and a lower-order surface, such as a (001) surface, of the current blocking layer 7 is formed continuously with the (111)B surface, the current blocking layer 7 is grown also on the (111)B surface, whereby the n type InP cladding layer 4 makes contact with the n type InP current blocking layer 7. Therefore, it is required to grow the current blocking layer 7 without forming the lower-order surface, such as the (001) surface, continuously with the (111)B surface of the p type InP mesa burying layer 6.

In the prior art semiconductor laser in which the mesa structure is buried with the semiconductor layers, the mesa is formed by wet etching as described above. However, the wet etching offers poor controllability, so that the height of the mesa and the length of the mask protruding over the mesa side surfaces are not uniform, whereby the growth configuration and the growth rate of the mesa burying layers vary. Accordingly, it is difficult to precisely control the thickness of the p type InP mesa burying layer 6 adjacent opposite sides of the active layer 3, i.e., the leakage current path width. In addition, the formation of the narrow mesa structure is difficult due to the side etching. Further, because the shape of the etching depends heavily on the surface orientation of crystals, it is very difficult to form the optical waveguide in an appropriate direction on the substrate.

In order to avoid these problems, a method including forming a mesa structure by dry etching has been studied. When dry etching is employed, uniformity in the wafer surface of the mesa structure is exceptionally improved as compared with when wet etching is employed. Further, since the mesa stripe is formed in an appropriate direction regardless of the surface orientation of the crystals, it is favorable for forming the optical waveguide. In dry etching, however, side etching of the mesa is hardly performed. Therefore, the mask does not protrude over the mesa side surfaces and the mesa side surfaces are almost perpendicular to the substrate surface, so that the surface of the burying layers is not continuous at a portion where the surface parallel to the mesa side surface is in contact with the surface parallel to the substrate surface. The growth configuration of the burying layers when the mask does not protrude and the grown surfaces are not continuous has not been quite made clear. Consequently, in order to realize an optical integrated device, it is required to make the growth configuration in the vicinity of the mesa structure that is formed by dry etching sufficiently clear and to obtain a buried structure that is suitable for device fabrication.

Currently, a buried structure that is suitable for fabrication of a device having a mesa structure formed by dry etching is disclosed only in Y. Kondo, et al., Extended Abstract No. 27p-ZA-5 pp. 930 of The Japan Society of Applied Physics. The buried structure is formed on an n type InP substrate, and a buried structure formed on a p type substrate has not been reported. This is probably because there are more limits to the growth when a semiconductor laser is formed on a p type InP substrate. That is, although current blocking layers comprise two layers of p type InP/n type InP in a semiconductor laser formed on the n type InP substrate, in a semiconductor laser formed on the p type InP substrate, the current blocking layers must comprise three layers of p type InP/n type InP/p type InP and the n type InP layer must not be in contact with an n type InP upper cladding layer.

However, when a laser array comprising a plurality of semiconductor lasers operates at high speed, a semiconductor laser array using a p type substrate is more favorable than a semiconductor laser array using the n type substrate. Generally, circuits shown in FIGS. 16(a) and 16(b) are used as driving circuits for driving such laser arrays. FIG. 16(a) is a circuit for driving a laser array 34 comprising semiconductor lasers 30 respectively using p type substrates, and n-p-n transistors 32 are used in this circuit. FIG. 16(b) is a circuit for driving a laser array 35 comprising semiconductor lasers 31 n type substrates, and p-n-p transistors 33 are used in this circuit. The operating speed of the n-p-n transistor is higher than that of the p-n-p transistor. Therefore, in order to drive the semiconductor lasers at higher speed, semiconductor laser array using the p type substrate is more favorable and has more merits in practical use than the semiconductor array using an n type substrate.

SUMMARY OF THE INVENTION

It is an object of the present invention to provide a semiconductor device including a mesa structure that is formed on a p type InP substrate by dry etching, and fine burying layers that bury the mesa structure. It is another object of the present invention to provide a method of fabricating the semiconductor device.

Other objects and advantages of the present invention will become apparent from the detailed description given hereinafter; it should be understood, however, that the detailed description and specific embodiment are given by way of illustration only, since various changes and modifications within the scope of the invention will become apparent to the those skilled in the art from this detailed description.

According to a first aspect of the present invention, a semiconductor device includes a p type InP substrate with a (001) surface orientation; a mesa structure formed by dry etching regions except a stripe-shaped region extending along a <110> direction, of semiconductor grown layers that are epitaxially grown on the p type InP substrate, the mesa structure having a $(1\bar{1}0)$ surface at opposite sides and a height $H_m$; and mesa burying layers including a p type InP burying layer epitaxially grown on the $(1\bar{1}0)$ surface at opposite sides of the mesa structure and on the (001) surface at an upper surface of the semiconductor grown layer that remains on opposite sides of the mesa structure, the p type InP burying layer having a thickness $D_p$, and an n type InP burying layer epitaxially grown on side and upper surfaces of the p type InP burying layer. In the semiconductor device, when an angle formed between the (111)B surface and the (001) surface is $\theta_{111}$, the growth rates of the n type InP burying layer on the $(1\bar{1}0)$ surface and on the (001) surface are respectively $R_g(\bar{1}0)$ and $R_g(001)$, an angle $\theta$ is determined by $\tan\theta = R_g(1\bar{1}0)/R_g(001)$, and the critical thickness $D_n$ of the n type InP burying layer grown on the (001) surface when the n type InP burying layer is not grown on the (111)B surface of the p type InP burying layer is represented by $$D_n = \frac{H_m - D_p \cdot (1 + \tan\theta_{111})}{1 + \tan\theta \cdot \tan\theta_{111}} = \frac{H_m - (1 + \sqrt{2})D_p}{1 + \sqrt{2}\,\tan\theta}$$

a thickness D of the n type InP burying layer grown on the (001) surface satisfies the relationship of $D \leq D_n$. Therefore, by controlling the thickness of the p type InP burying layer, the leakage current path width is narrowed with good controllability. Further, the n type InP burying layer is not grown on the (111)B surface of the p type InP burying layer, whereby the contact of the n type InP burying layer and an uppermost layer of the semiconductor grown layers is avoided. Consequently, a semiconductor device having reduced leakage current and superior device characteristics can be obtained.

According to a second aspect of the present invention, in the above-described semiconductor device, the epitaxially grown semiconductor layers include an active layer emitting laser light and an n type first cladding layer grown on the active layer, and the n type InP burying layer is an n type InP current blocking layer. Further, the semiconductor device includes a p type InP current blocking layer epitaxially grown on the n type InP current blocking layer. Therefore, the leakage current path width is narrowed with good controllability, and the contact of the n type InP current blocking layer and the n type first cladding layer as the uppermost layer of the semiconductor grown layers is avoided. Consequently, a semiconductor laser having reduced leakage current and superior laser characteristics can be obtained.

According to a third aspect of the present invention, in the above-described semiconductor device, the mesa burying layers further include an n type InP covering layer grown on the p type InP current blocking layer. Further, the semiconductor device includes an n type InP second cladding layer and an n type InP contact layer that are successively epitaxially grown on the entire surfaces of the first cladding layer as an uppermost layer of the mesa and the n type InP covering layer as an uppermost layer of the mesa burying layers. In the semiconductor device, when an angle formed between the (111)B surface and the (001) surface is $\theta_{111}$, the growth rates of the n type InP current blocking layer on the ($1\bar{1}0$) surface and on the (001) surface are respectively $R_g(1\bar{1}0)$ and $R_g(001)$, an angle $\theta$ is determined by $\tan\theta = R_g(1\bar{1}0)/R_g(001)$, and the critical thickness $D_n$ of the n type InP layer grown on the (001) surface when the n type InP layer is not grown on the (111)B surface of the p type InP burying layer is represented by $$D_n = \frac{H_m - D_p \cdot (1 + \tan\theta_{111})}{1 + \tan\theta \cdot \tan\theta_{111}} = \frac{H_m - (1 + \sqrt{2})D_p}{1 + \sqrt{2}\,\tan\theta}$$

a thickness D of the n type InP current blocking layer grown on the (001) surface satisfies the relationship of $D \leq D_n$. Therefore, the leakage current path width is narrowed with good controllability, and the contact of the n type InP current blocking layer and the n type first cladding layer as the uppermost layer of the semiconductor grown layers is avoided. Consequently, a semiconductor laser having reduced leakage current and superior laser characteristics can be obtained. In addition, the n type InP second cladding layer is regrown on the n type InP covering layer and this regrowth interface is not a p-n junction interface but an interface between the n type layers. Therefore, an increase in leakage current due to interface deterioration that is caused when the regrowth interface is the p-n junction interface is avoided, whereby reliability of the semiconductor laser is improved as compared with the semiconductor device in which the n type InP second cladding layer is grown on the p type InP current blocking layer.

According to a fourth aspect of the present invention, a method of fabricating a semiconductor device includes epitaxially growing semiconductor grown layers on a surface of a p type InP substrate, i.e., a (001) surface; depositing an insulating film on a stripe-shaped region of the semiconductor grown layers extending along a <110> direction; using the insulating film as a mask, dry-etching regions except the stripe-shaped region of the semiconductor grown layers to form a mesa structure extending along the <110> direction and having a ($1\bar{1}0$) surface at opposite sides and a height $H_m$; and using the insulating film as a mask, successively growing by selective epitaxial growth a p type InP burying layer having a thickness $D_p$ and an n type InP burying layer on the ($1\bar{1}0$) surface at opposite sides of the mesa structure and on the (001) surface at an upper surface of the semiconductor grown layer that remains on opposite sides of the mesa structure. In this fabricating method, when an angle formed between the (111)B surface and the (001) surface is $\theta_{111}$, the growth rates of the n type InP burying layer on the ($1\bar{1}0$) surface and on the (001) surface are respectively $R_g(1\bar{1}0)$ and $R_g(001)$, an angle $\theta$ is determined by $\tan\theta = R_g(1\bar{1}0)/R_g(001)$, and the critical thickness $D_n$ of the n type InP burying layer grown on the (001) surface when the n type InP burying layer is not grown on the (111)B surface of the p type InP burying layer is represented by $$D_n = \frac{H_m - D_p \cdot (1 + \tan\theta_{111})}{1 + \tan\theta \cdot \tan\theta_{111}} = \frac{H_m - (1 + \sqrt{2})D_p}{1 + \sqrt{2}\,\tan\theta}$$

a thickness D of the n type InP burying layer grown on the (001) surface satisfies the relationship of $D \leq D_n$. Therefore, by controlling the thickness of the p type InP burying layer, the leakage current path width is narrowed with good controllability. Further, the n type InP burying layer is not grown on the (111)B surface of the p type InP burying layer, whereby the contact of the n type InP burying layer and an uppermost layer of the semiconductor grown layers is avoided. Consequently, a semiconductor device having reduced leakage current and superior device characteristics can be fabricated. In addition, because the mesa formation is performed by dry etching, a fine mesa structure is formed with good controllability and an optical waveguide comprising the mesa is formed in an appropriate direction because the mesa stripe is extended in an appropriate direction. Consequently, an optical integrated device having superior characteristics can be fabricated with good controllability.

According to a fifth aspect of the present invention, in the above-described method of fabricating a semiconductor device, epitaxially growing the semiconductor grown layers comprises successively epitaxially growing a p type InP buffer layer, an active layer emitting laser light, and an n type InP first cladding layer on the surface of the p type InP substrate, i.e., the (001) surface, the n type InP burying layer is an n type InP current blocking layer, and growing the mesa burying layers comprises epitaxially growing a p type InP current blocking layer subsequently to the epitaxial growth of the p type InP burying layer and the n type InP current blocking layer. Therefore, the leakage current path width is narrowed with good controllability, and the contact of the n type InP burying layer and the n type InP cladding layer as the uppermost layer of the semiconductor grown layers is avoided. Consequently, a semiconductor laser having reduced leakage current and superior laser characteristics can be fabricated. In addition, because the mesa formation is performed by dry etching, a fine mesa structure is formed with good controllability and an optical waveguide comprising the mesa is formed in an appropriate direction. Consequently, an optical integrated device having superior characteristics can be fabricated with good controllability.

According to a sixth aspect of the present invention, in the above-described method of fabricating a semiconductor device, growing the mesa burying layers comprises epitaxially growing an n type InP covering layer subsequently to the epitaxial growth of the p type InP burying layer, the n type InP current blocking layer, and the p type InP current blocking layer and, after growing the mesa burying layers, the method further includes successively epitaxially growing an n type InP second cladding layer and an n type InP contact layer over the entire surfaces of the n type InP first cladding layer as an uppermost layer of the mesa and the n type InP covering layer as an uppermost layer of the mesa burying layers. In this fabricating method, when an angle formed between the (111)B surface and the (001) surface is $\theta_{111}$, the growth rates of the n type InP current blocking layer on the ($1\bar{1}0$) surface and on the (001) surface are respectively $R_g(1\bar{1}0)$ and $R_g(001)$, an angle $\theta$ is determined by $\tan\theta = R_g(1\bar{1}0)/R_g(001)$, and the critical thickness $D_n$ of the n type InP layer grown on the (001) surface when the n type InP layer is not grown on the (111)B surface of the p type InP burying layer is represented by $$D_n = \frac{H_m - D_p \cdot (1 + \tan\theta_{111})}{1 + \tan\theta \cdot \tan\theta_{111}} = \frac{H_m - (1 + \sqrt{2})D_p}{1 + \sqrt{2}\tan\theta}$$

a thickness D of the n type InP current blocking layer grown on the (001) surface satisfies the relationship of $D \leq D_n$. Therefore, the leakage current path width is narrowed with good controllability, and the contact of the n type InP current blocking layer and the n type InP cladding layer as the uppermost layer of the semiconductor grown layers is avoided. Consequently, a semiconductor laser having reduced leakage current and superior laser characteristics can be fabricated. In addition, because the mesa formation is performed by dry etching, a fine mesa structure is formed with good controllability and an optical waveguide comprising the mesa is formed in an appropriate direction. Consequently, an optical integrated device having superior characteristics can be fabricated with good controllability. Further, the n type InP second cladding layer is regrown on the n type InP covering layer and this regrowth interface is not a p-n junction interface but an interface between the n type layers. Therefore, an increase in leakage current due to interface deterioration that is caused when the regrowth interface is the p-n junction interface is avoided, whereby reliability of the semiconductor laser is improved as compared with the semiconductor laser in which the n type InP second cladding layer is grown on the p type InP current blocking layer.

According to a seventh aspect of the present invention, a semiconductor device includes a semiconductor substrate; a mesa structure formed by dry etching regions except a stripe-shaped region of semiconductor grown layers including an active layer emitting laser light and epitaxially grown on the semiconductor substrate; and mesa burying layers epitaxially grown on opposite side surfaces of the mesa structure and on an upper surface of the semiconductor grown layer that remains on opposite sides of the mesa structure. In this semiconductor device, a striation width W of the side surface of the stripe-shaped mesa is smaller than or equal to 40 nm. Therefore, a laser having superior temperature characteristics, in which leakage current at room temperature is suppressed, threshold current is reduced, and an increase in leakage current at high temperature is suppressed, whereby deterioration of laser characteristics at high temperature is prevented, can be obtained.

According to an eighth aspect of the present invention, in the above-described semiconductor device, the semiconductor substrate is a p type InP substrate with a (001) surface orientation. The mesa structure is formed by dry etching the regions except the stripe-shaped region extending along a <110> direction, of the semiconductor grown layers that are epitaxially grown on the p type InP substrate, the mesa structure having a $(1\bar{1}0)$ surface at opposite sides and a height $H_m$. The mesa burying layers include a p type InP burying layer epitaxially grown on the $(1\bar{1}0)$ surface at opposite sides of the mesa structure and on the (001) surface at the upper surface of the semiconductor grown layer that remains on opposite sides of the mesa structure, the p type InP burying layer having a thickness $D_p$, and an n type InP burying layer epitaxially grown on side and upper surfaces of the p type InP burying layer. In the semiconductor device, when an angle formed between the (111)B surface and the (001) surface is $\theta_{111}$, the growth rates of the n type InP burying layer on the $(1\bar{1}0)$ surface and on the (001) surface are respectively $R_g(1\bar{1}0)$ and $R_g(001)$, an angle $\theta$ is determined by $\tan\theta = R_g(1\bar{1}0)/R_g(001)$, and the critical thickness $D_n$ of the n type InP burying layer grown on the (001) surface when the n type InP burying layer is not grown on the (111)B surface of the p type InP burying layer is represented by $$D_n = \frac{H_m - D_p \cdot (1 + \tan\theta_{111})}{1 + \tan\theta \cdot \tan\theta_{111}} = \frac{H_m - (1 + \sqrt{2})D_p}{1 + \sqrt{2}\tan\theta}$$

a thickness D of the n type InP burying layer grown on the (001) surface satisfies the relationship of $D \leq D_n$.

Therefore, a laser having superior temperature characteristics, in which leakage current at room temperature is suppressed, threshold current is reduced, and an increase in leakage current at high temperature is suppressed, whereby deterioration of laser characteristics at high temperature is prevented, can be obtained. In addition, by controlling the thickness of the p type InP burying layer, the leakage current path width is narrowed with good controllability. Further, the n type InP burying layer is not grown on the (111)B surface of the p type InP burying layer, whereby the contact of the n type InP burying layer and an uppermost layer of the semiconductor grown layers is avoided. Consequently, a semiconductor laser having reduced leakage current and superior device characteristics can be obtained.

According to a ninth aspect of the present invention, in the above-described semiconductor device, the epitaxially grown semiconductor layers include the active layer and an n type first cladding layer grown on the active layer. The n type InP burying layer of the mesa burying layers is an n type InP current blocking layer. Further, the semiconductor device includes a p type InP current blocking layer epitaxially grown on the n type InP current blocking layer. Therefore, a laser having superior temperature characteristics, in which leakage current at room temperature is suppressed, threshold current is reduced, and an increase in leakage current at high temperature is suppressed, whereby deterioration of laser characteristics at high temperature is prevented, can be obtained. In addition, the leakage current path width is narrowed with good controllability, and the contact of the n type InP current blocking layer and the n type first cladding layer as the uppermost layer of the semiconductor grown layers is avoided. Consequently, a semiconductor laser having reduced leakage current and superior laser characteristics can be obtained.

According to a tenth aspect of the present invention, in the above-described semiconductor device, the mesa burying layers further include an n type InP covering layer grown on the p type InP current blocking layer. Further, the semiconductor device includes an n type second cladding layer and an n type InP contact layer that are successively epitaxially grown on the entire surfaces of the first cladding layer as an uppermost layer of the mesa and the n type InP covering layer as an uppermost layer of the mesa burying layers. In the semiconductor device, when an angle formed between the (111)B surface and the (001) surface is $\theta_{111}$, a striation width W of the side surface of the stripe-shaped mesa is smaller than or equal to 40 nm, the growth rates of the n type InP current blocking layer on the $(1\bar{1}0)$ surface and on the (001) surface are respectively $R_g(1\bar{1}0)$ and $R_g(001)$, an angle $\theta$ is determined by $\tan\theta = R_g(1\bar{1}0)$, and the critical thickness $D_n$ of the n type InP layer grown on the (001) surface when the n type InP layer is not grown on the (111)B surface of the p type InP burying layer is represented by $$D_n = \frac{H_m - D_p \cdot (1 + \tan\theta_{111})}{1 + \tan\theta \cdot \tan\theta_{111}} = \frac{H_m - (1 + \sqrt{2})D_p}{1 + \sqrt{2}\tan\theta}$$

a thickness D of the n type InP current blocking layer grown on the (001) surface satisfies the relationship of $D \leq D_n$. Therefore, a laser having superior temperature characteristics, in which leakage current at room temperature is suppressed, threshold current is reduced, and an increase in leakage current at high temperature is suppressed, whereby deterioration of laser characteristics at high temperature is prevented, can be fabricated. In addition, the leakage current path width is narrowed with good controllability and the contact of the n type InP current blocking layer and the n type InP first cladding layer as the uppermost layer of the semiconductor grown layers is avoided, whereby a semiconductor laser having reduced leakage current and superior laser characteristics can be fabricated. Further, the n type InP second cladding layer is regrown on the n type InP covering layer and this regrowth interface is not a p-n junction interface but an interface between the n type layers. Therefore, an increase in leakage current due to interface deterioration that is caused when the regrowth interface is the p-n junction interface is avoided, whereby reliability of the semiconductor laser is improved as compared with the semiconductor laser in which the n type InP second cladding layer is grown on the p type InP current blocking layer.

According to an eleventh aspect of the present invention, a method of fabricating a semiconductor device includes epitaxially growing semiconductor grown layers including an active layer emitting laser light on a semiconductor substrate; dry-etching regions except a stripe-shaped region of the semiconductor grown layers to form a mesa structure having a striation width W smaller than or equal to 40 nm at its side surface; and epitaxially growing mesa burying layers on opposite side surfaces of the mesa structure and on an upper surface of the semiconductor grown layer that remains on opposite sides of the mesa structure. Therefore, a laser having superior temperature characteristics, in which leakage current at room temperature is suppressed, threshold current is reduced, and an increase in leakage current at high temperature is suppressed, whereby deterioration of laser characteristics at high temperature is prevented, can be fabricated.

According to a twelfth aspect of the present invention, in the above-described method of fabricating a semiconductor device, epitaxially growing the semiconductor grown layers comprises epitaxially growing the semiconductor grown layers on a surface of a p type InP substrate, i.e., a (001) surface; forming the mesa structure comprises depositing an insulating film on the stripe-shaped region of the semiconductor grown layers extending along a <110> direction, using the insulating film as a mask, dry-etching the regions except the stripe-shaped region to form a mesa structure extending along the <110> direction and having a (1$\bar{1}$0) surface at opposite sides and a height $H_m$; and epitaxially growing the mesa burying layers comprises using the insulating film as a mask, successively growing by selective epitaxial growth a p type InP burying layer having a thickness $D_p$ and an n type InP burying layer on the (1$\bar{1}$0) surface at opposite sides of the mesa structure and on the (001) surface at the upper surface of the semiconductor grown layer that remains on opposite sides of the mesa structure. In this fabricating method, when an angle formed between the (111)B surface and the (001) surface is $\theta_{111}$, the growth rates of the n type InP burying layer on the (1$\bar{1}$0) surface and on the (001) surface are respectively $R_g(1\bar{1}0)$ and $R_g(001)$, an angle $\theta$ is determined by $\tan\theta = R_g(1\bar{1}0)/R_g(001)$, and the critical thickness $D_n$ of the n type InP burying layer grown on the (001) surface when the n type InP burying layer is not grown on the (111)B surface of the p type InP burying layer is represented by $$D_n = \frac{H_m - D_p \cdot (1 + \tan\theta_{111})}{1 + \tan\theta \cdot \tan\theta_{111}} = \frac{H_m - (1 + \sqrt{2})D_p}{1 + \sqrt{2}\tan\theta}$$

a thickness D of the n type InP burying layer grown on the (001) surface satisfies the relationship of $D \leq D_n$. Therefore, a laser having superior temperature characteristics, in which leakage current at room temperature is suppressed, threshold current is reduced, and an increase in leakage current at high temperature is suppressed, whereby deterioration of laser characteristics at high temperature is prevented, can be fabricated. In addition, by controlling the thickness of the p type InP burying layer, the leakage current path width is narrowed with good controllability, whereby a semiconductor device having reduced leakage current and superior device characteristics can be fabricated. Further, because the mesa formation is performed by dry etching, a fine mesa structure is formed with good controllability and an optical waveguide comprising the mesa is formed in an appropriate direction because the mesa stripe is extended in an appropriate direction. Consequently, an optical integrated device having superior characteristics can be fabricated with good controllability.

According to a thirteenth aspect of the present invention, in the above-described method of fabricating a semiconductor device, epitaxially growing the semiconductor grown layers comprises successively epitaxially growing a p type InP buffer layer, an active layer, and an n type InP first cladding layer on the surface of the p type InP substrate, i.e., the (001) surface; the n type InP burying layer is an n type InP current blocking layer; and growing the mesa burying layers comprises epitaxially growing a p type InP current blocking layer subsequently to the epitaxial growth of the p type InP burying layer and the n type InP current blocking layer. Therefore, a laser having superior temperature characteristics, in which leakage current at room temperature is suppressed, threshold current is reduced, and an increase in leakage current at high temperature is suppressed, whereby deterioration of laser characteristics at high temperature is prevented, can be fabricated. In addition, the leakage current path width is narrowed with good controllability and the contact of the n type InP current blocking layer and the n type InP first cladding layer as the uppermost layer of the semiconductor grown layers is avoided, whereby a semiconductor laser having reduced leakage current and superior laser characteristics can be fabricated. Further, because the mesa formation is performed by dry etching, a fine mesa structure is performed with good controllability and an optical waveguide comprising the mesa is formed in an appropriate direction. Consequently, an optical integrated device having superior characteristics can be fabricated with good controllability.

According to a fourteenth aspect of the present invention, in the above-described method of fabricating a semiconductor device, growing the mesa burying layers comprises epitaxially growing an n type InP covering layer subsequently to the epitaxial growth of the p type InP burying layer, the n type InP current blocking layer, and the p type InP current blocking layer and, after growing the mesa burying layers, the method further includes successively epitaxially growing an n type InP second cladding layer and an n type InP contact layer over the entire surfaces of the n type InP first cladding layer as an uppermost layer of the mesa and the n type InP covering layer as an uppermost layer of the mesa burying layers. In this fabricating method, when an angle formed between the (111)B surface and the (001) surface is $\theta_{111}$, a striation width W of the side surface of the mesa is smaller than or equal to 40 nm, the growth rates of the n type InP current blocking layer on the $(1\bar{1}0)$ surface and on the (001) surface are respectively $R_g(1\bar{1}0)$ and $R_g(001)$, an angle $\theta$ is determined by $\tan \theta = R_g(1\bar{1}0)/R_g(001)$, and the critical thickness $D_n$ of the n type InP layer grown on the (001) surface when the n type InP layer is not grown on the (111)B surface of the p type InP burying layer is represented by $$D_n = \frac{H_m - D_p \cdot (1 + \tan \theta_{111})}{1 + \tan \theta \cdot \tan \theta_{111}} = \frac{H_m - (1 + \sqrt{2}) D_p}{1 + \sqrt{2} \tan \theta}$$

a thickness D of the n type InP current blocking layer grown on the (001) surface satisfies the relationship of $D \leq D_n$. Therefore, a laser having superior temperature characteristics, in which leakage current at room temperature is suppressed, threshold current is reduced, and an increase in leakage current at high temperature Is suppressed, whereby deterioration of laser characteristics at high temperature is prevented, can be fabricated. In addition, the leakage current path width is narrowed with good controllability and the contact of the n type InP current blocking layer and the n type InP first cladding layer as the uppermost layer of the semiconductor grown layers is avoided, whereby a semiconductor laser having reduced leakage current and superior laser characteristics can be fabricated. Further, because the mesa formation is performed by dry etching, a fine mesa structure is formed with good controllability and an optical waveguide comprising the mesa is formed in an appropriate direction. Consequently, an optical integrated device having superior characteristics can be fabricated with good controllability. Furthermore, the n type InP second cladding layer is regrown on the n type InP covering layer and this regrowth interface is not a p-n junction interface but an interface between the n type layers. Therefore, an increase in leakage current due to interface deterioration that is caused when the regrowth interface is the p-n junction interface is avoided, whereby reliability of the semiconductor laser is improved as compared with the semiconductor laser in which the n type InP second cladding layer is grown on the p type InP current blocking layer.

BRIEF DESCRIPTION OF THE DRAWINGS

FIGS. 3(a)–3(c) are cross-sectional views illustrating thickness dependency in growth configurations of the n type InP burying layer which buries the mesa structure formed by dry etching.

DETAILED DESCRIPTION OF THE EMBODIMENT

The inventors experimentally investigated the growth configuration of layers that bury a mesa structure formed by dry etching and having side surfaces almost perpendicular to a substrate surface.

Figure 1:
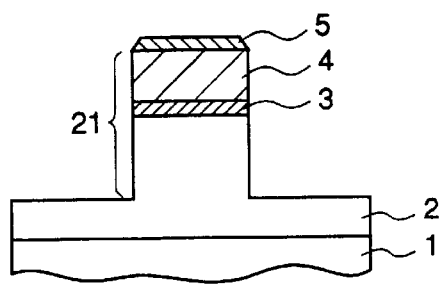
FIGS. 1(a)–1(e) are cross-sectional views illustrating carrier concentration dependency in growth configurations of an n type InP burying layer which buries a mesa structure formed by dry etching.
Figure 1:
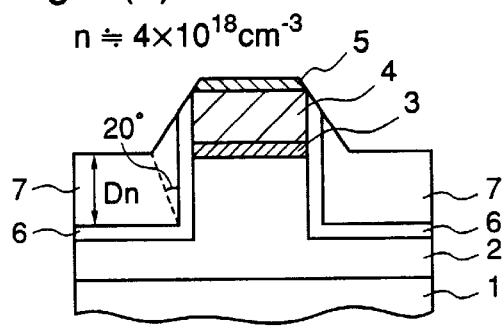
Figure 1:
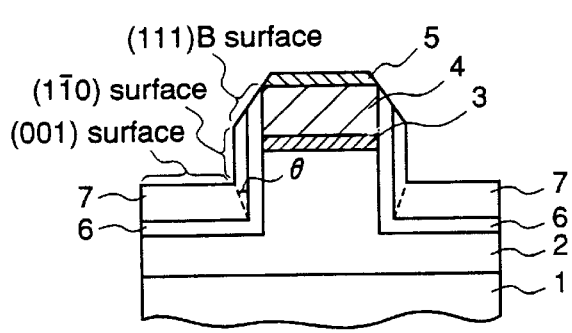
Figure 1:
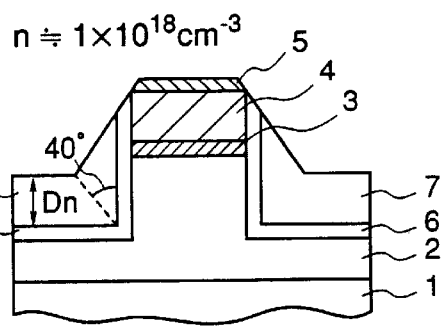
Figure 1:
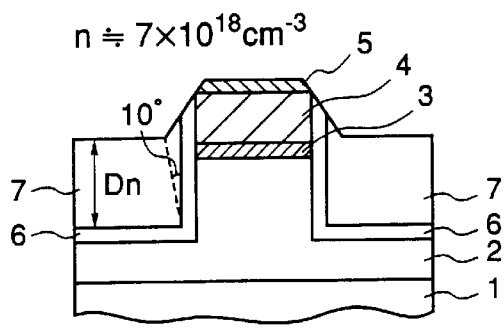

A description is given of the growth configuration of the mesa burying layers. FIGS. 1(a)–1(e) are cross-sectional views each illustrating a sample used for the experiment in the growth configuration. The cross-section is perpendicular to a <110> direction. Initially, a p type InP buffer layer 2, an InGaAsP active layer 3, and an n type InP first cladding layer 4 are successively epitaxially grown on a p type InP substrate 1. Then, an $SiO_2$ film 5 is deposited on a stripe-shaped region of the first cladding layer surface extending along the <110> direction. As shown in FIG. 1(a), using the $SiO_2$ film 5 as a mask, dry etching is performed to form a mesa 21 with side surfaces almost perpendicular to the substrate surface, i.e., the (001) surface. Thereafter, using the $SiO_2$ film 5 as a mask, a p type InP layer 6 and an n type InP layer 7 are successively selectively grown to bury the mesa 21. As a result of the investigation of the growth configuration of the mesa burying layers, the following facts are made clear.

As shown in FIG. 1(b), the p type InP layer 6 grows to almost keep the shapes of the side surface of the mesa 21, i.e., the $(1\bar{1}0)$ surface, and the upper surface of the buffer layer 2 which remains on opposite sides of the mesa 21, i.e., the (001) surface.

Figure 2:
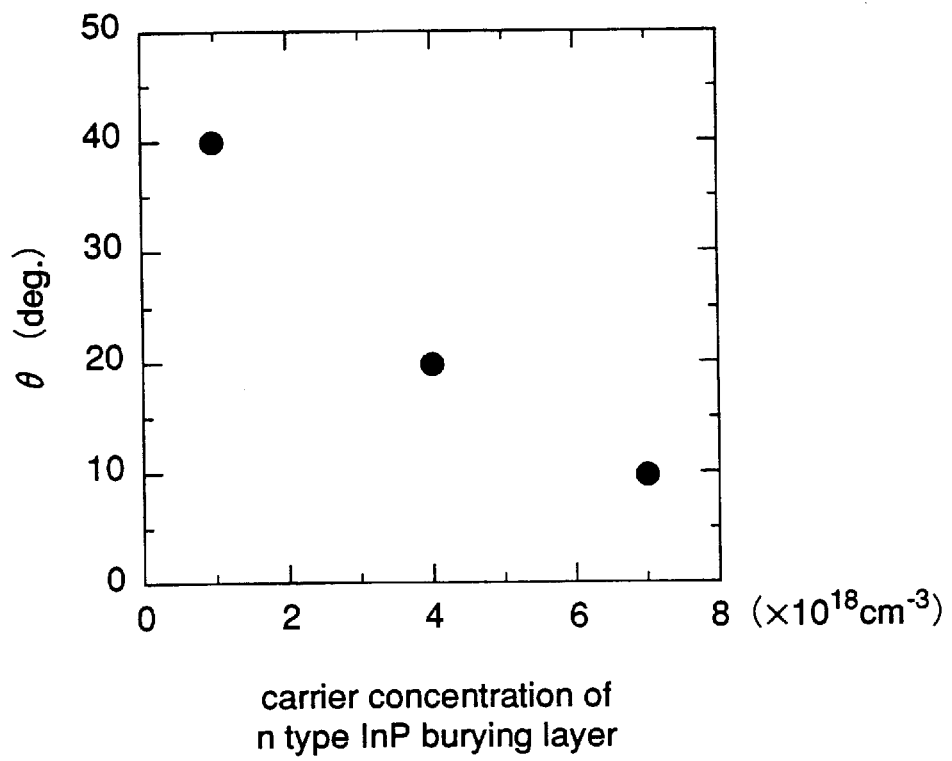
FIG. 2 is a diagram illustrating carrier concentration dependency of an angle $\theta$ in the n type InP burying layer.

Further, when the n type InP layer 7 is grown, the upper surface of the buffer layer 2 ((001) surface) which remains on opposite sides of the mesa 21 and the mesa side surface ((1$\bar{1}$0) surface) are different in growth rate. As the carrier concentration of the n type InP layer 7 increases, the growth rate at the mesa side decreases, whereby an angle θ between the mesa side surface and a broken line shown in FIG. 1(b), i.e., a surface where the grown surface of the n type InP layer 7 opposite the upper surface of the buffer layer 2 on opposite sides of the mesa ((001) surface) makes contact with the grown surface on opposite the mesa side surface ((1$\bar{1}$0) surface), becomes smaller. Specific examples are shown in FIGS. 1(c)–1(e). As is known from these figures, when the carrier concentrations n of the n type InP layer 7 are about 7×10$^{18}$ cm$^{-3}$, 4×10$^{18}$ cm$^{-3}$, and 1×10$^{18}$cm$^{-3}$, the angles θ are 10°, 20°, and 40°, respectively. In the cross-sections shown in the figures, the growth of the n type InP layer 7 has proceeded until the (001) surface of the n type InP layer 7 converges with the (111)B surface, i.e., the (1$\bar{1}$0) surface disappears. FIG. 2 is a diagram showing a relation between the angle θ and the carrier concentration of the n type InP layer 7.

Assuming that the thickness of the n type InP layer 7 grown on the (001) surface is D and the thickness D when the (001) surface of the n type InP layer 7 converges with the (111)B surface is D$_n$, the growth configuration of the n type InP layer 7 when the thickness D is smaller than the thickness D$_n$ is widely different from the growth configuration when D is larger than D$_n$. FIGS. 3(a)–3(c) are cross-sectional views each illustrating the state in which the growth configuration of the n type InP layer 7 depends on its thickness D with of a fixed carrier concentration. As shown in FIG. 3(a), when D is smaller than D$_n$, the (111)B surface and the (1$\bar{1}$0) surface form the sides of the mesa, and the (001) surface that forms the crystal surface on opposite sides of the mesa does not continue with the (111)B surface. When the thickness D becomes thicker and is equal to D$_n$, the (1$\bar{1}$0) surface disappears and the (001) surface and the (111)B surface become a continuous surface (FIG. 3(b)). Further, when the growth of the n type InP layer 7 proceeds and D is larger than D$_n$, the n type InP layer 7 is grown also on the (111)B surface of the p type InP burying layer 6 (FIG. 3(c)). In order to complete a semiconductor laser, a p type current blocking layer is grown on the n type InP layer 7 serving as a current blocking layer and, after removing the SiO$_2$ film 5, a second cladding layer and a contact layer are grown over the entire surface. In this growth, if the n type InP layer 7 is grown on the (111)B surface of the p type InP burying layer 6, contact of the n type InP layer 7 and the n type InP first cladding layer 4 is produced, resulting in considerable deterioration of laser characteristics.

Figure 4:
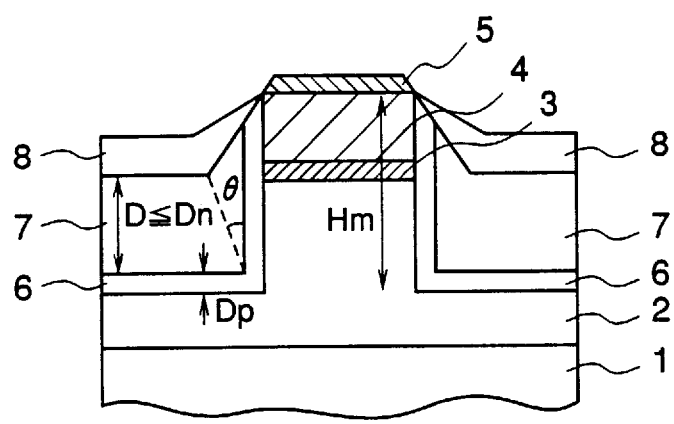
FIG. 4 is a cross-sectional view for explaining a process for growing mesa burying layers in methods of fabricating a semiconductor laser according to the present invention.

The present invention is based on the above-described knowledge. As shown in FIG. 4, when the mesa 21 having a height H$_m$ and formed by dry etching is buried with the p type InP burying layer 6 having a thickness D$_p$ sand the n type InP burying layer (current blocking layer) 7, the thickness D of the n type InP layer 7 grown on the (001) surface is smaller than or equal to D$_n$ in order not to grow the n type InP layer 7 on the (111)B surface of the p type InP burying layer 6. When the growth rates of the n type InP layer 7 on the (1$\bar{1}$0) surface and on the (001) surface are respectively R$_g$(1$\bar{1}$0) and R$_g$(001), the angle θ is represented by tan θ=R$_g$(1$\bar{1}$0)/R$_g$(001) In addition, when an angle formed between the (111)B surface and the (001) surface is θ$_{111}$, the critical thickness D$_n$ of the n type InP layer 7 grown on the (001) surface when the n type InP layer 7 is not grown on the (111)B surface of the p type InP burying layer 6 is represented by $$D_n = \frac{H_m - D_p \cdot (1 + \tan\theta_{111})}{1 + \tan\theta \cdot \tan\theta_{111}} = \frac{H_m - (1 + \sqrt{2})D_p}{1 + \sqrt{2}\,\tan\theta}$$

The value of tan θ$_{111}$ is √2. On the basis of the above-described investigation by the inventors, embodiments according to the present invention will be described hereinafter.

Embodiment 1

A description is given of a semiconductor device and a method of fabricating the semiconductor device according to a first embodiment of the present invention.

Figure 5:
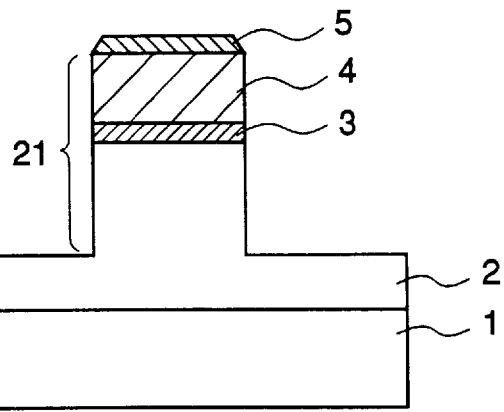
FIGS. 5(a)–5(c) are cross-sectional views illustrating process steps in a method of fabricating a semiconductor laser and a semiconductor laser that is fabricated by the method in accordance with a first embodiment of the present invention.
Figure 5:
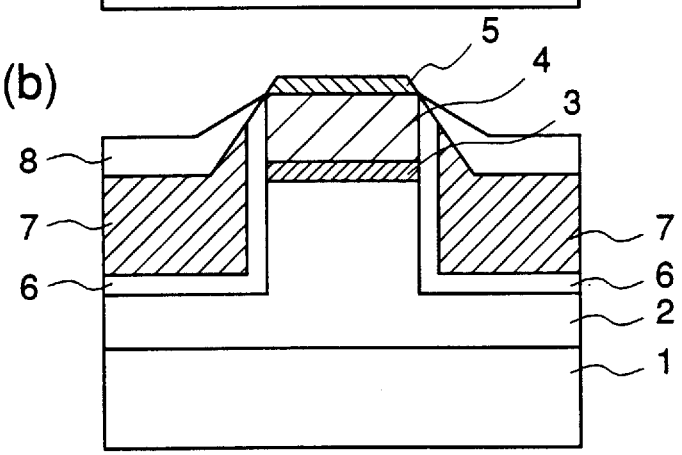
Figure 5:
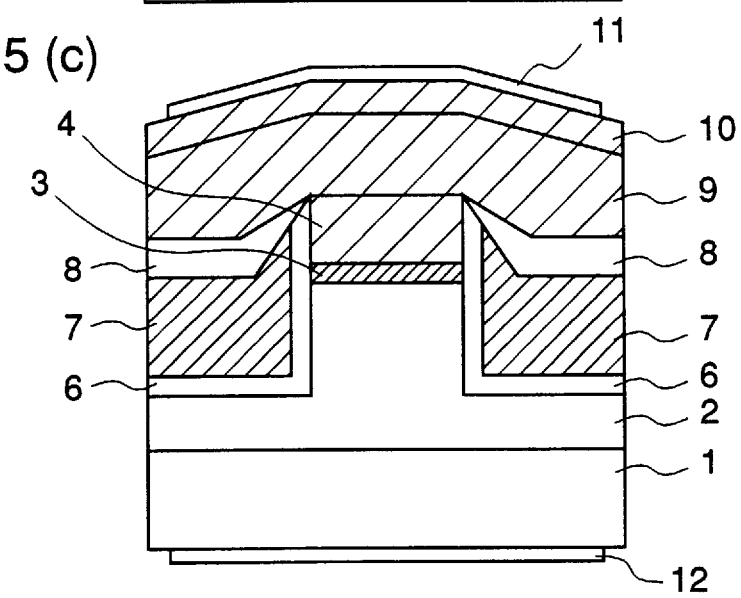

FIGS. 5(a)–5(c) are cross-sectional views illustrating process steps in a method of fabricating a semiconductor laser including forming a mesa structure by dry etching of layers grown on a p type InP substrate. FIG. 4 is a cross-sectional view illustrating a semiconductor laser that is fabricated by the above-described method.

Initially, on a p type InP wafer 1 with a (001) surface at its front surface, a p type InP buffer layer 2 having a carrier concentration of 1×10$^{18}$ cm$^{-3}$ and a thickness of 1.8 μm, an undoped InGaAsP active layer 3 having a thickness of 0.1 μm and a band gap energy corresponding to a wavelength of 1.3 μm, and an n type InP first cladding layer 4 having a carrier concentration of 1×10$^{18}$ cm$^{-3}$ and a thickness of 0.7 μm are successively grown, preferably by MOCVD or gas source MBE (molecular beam epitaxy), to form semiconductor grown layers having a double heterojunction structure. The active layer 3 may not be an InGaAsP single layer but a layer having a multi quantum-well structure. Next, an SiO$_2$ film 5 serving as a mask for selective growth having a width of 1.5 μm is deposited on a stripe-shaped region of the first cladding layer 4 extending along a <110> direction, preferably by sputtering or CVD (chemical vapor deposition). In the step of FIG. 5(a), using this SiO$_2$ film 5 as a mask, the semiconductor grown layers are subjected to dry etching, such as RIE (reactive ion etching), preferably using C$_2$H$_6$+H$_2$, to form a mesa structure 21 extending along the <110> direction. For example, a height H$_m$ of the mesa, i.e., an etching depth, is set to 2.0 μm. In the etching, the upper surface of the p type InP buffer layer 2 that remains on opposite sides of the mesa becomes a (001) surface, and the mesa side surface almost becomes a (1$\bar{1}$0) surface. The gas mixture used for the dry etching may be CH$_4$+H$_2$ or CH$_4$+H$_2$+O$_2$.

Then, as shown in FIG. 5(b), using the SiO$_2$ film 5 as a mask, a p type InP mesa burying layer 6 having a carrier concentration of 8×10$^{17}$ cm$^{-3}$ and a thickness of 0.2 μm, an n type InP current blocking layer 7 having a carrier concentration of 7×10$^{18}$ cm$^{-3}$ and having a thickness of 1.2 μm on the (001) surface, and a p type InP current blocking layer 8 having a carrier concentration of 8×10$^{17}$ cm$^{-3}$ and a thickness of 0.6 μm are successively selectively grown by MOCVD on regions of the wafer that are not masked with the SiO$_2$ film 5. In this growth, the (001) surface and the (1$\bar{1}$0) surface form the surface of the p type InP mesa burying layer 6 after the growth, and the n type InP current blocking layer 7 is grown on these surfaces as shown in FIG. 1(b). Because the carrier concentration of the n type InP current blocking layer 7 is 7×10$^{18}$ cm$^{-3}$, it is known from FIG. 2 that an angle θ, which is formed between the (1$\bar{1}$0) surface and a plane surface including a line where the (001) surface and the (1$\bar{1}$0) surface as the grown surfaces of the n type InP current blocking layer 7 are adjacent to each other and a line where the (001) surface and the (1$\bar{1}$0) surface as the surfaces of the p type InP mesa burying layer 6 are adjacent to each other, is 10°. When the growth rates of the n type InP mesa burying layer 7 on the (1$\bar{1}$0) surface and on the (001) surface are respectively $R_g$(1$\bar{1}$0) and $R_g$(001) the angle θ is represented by tan θ=$R_g$(1$\bar{1}$0)/$R_g$(001). Therefore, in order not to grow the n type InP current blocking layer 7 on the (111)B surface of the p type InP mesa burying layer 6, the critical thickness $D_n$ of the current blocking layer 7 grown on the (001) surface is 1.214 μm, which is obtained from the above-described formula $$D_n = \frac{H_m - D_p \cdot (1 + \tan \theta_{111})}{1 + \tan \theta \cdot \tan \theta_{111}} = \frac{H_m - (1 + \sqrt{2}) D_p}{1 + \sqrt{2} \tan \theta}$$

where $D_p$ is the thickness of the p type InP mesa burying layer 6 and $\theta_{111}$ is an angle formed between the (111)B surface and the (001) surface. The value of tan $\theta_{111}$ is $\sqrt{2}$. Consequently, the thickness D of the n type InP current blocking layer 7 grown on the (001) surface is 1.2 μm, and this satisfies the relationship of D≦$D_n$.

In the step of FIG. 5(c), after removing the $SiO_2$ film 5 using an HF system etchant, an n type InP second cladding layer 9 having a carrier concentration of 1×10$^{18}$ cm$^{-3}$ and a thickness of 1.5 μm and an n type InP contact layer 10 having a carrier concentration of 7×10$^{18}$ cm$^{-3}$ and a thickness of 0.5 μm are successively grown over the entire surface of the wafer, preferably by MOCVD or gas source MBE. Thereafter, a front electrode 11 comprising Cr/Au and having a thickness of 200 nm is formed on the surface of the n type InP contact layer 10, preferably by sputtering. A rear electrode 12 comprising AuZn and having a thickness of 100 nm is formed on the rear surface of the p type InP substrate 1, preferably by EB (electron beam) evaporation. Then, the wafer is cleaved to separate semiconductor laser chips, each laser having a cavity length of 300 ~600 μm, from each other. Finally, a front facet of each chip is coated with a front facet reflection film comprising an $Al_2O_3$ film and having a thickness of about 400 nm and a reflectivity of 30% and a back facet is coated with a back facet reflection film comprising $SiO_2$, Si, $SiO_2$, and $Al_2O_3$ layers, respectively having thicknesses of about 220, 100, 220, and 400 nm, which layers are successively laminated and have a reflectivity of 60%, preferably by EB evaporation, completing the semiconductor laser shown in FIG. 5(c).

Figure 6:
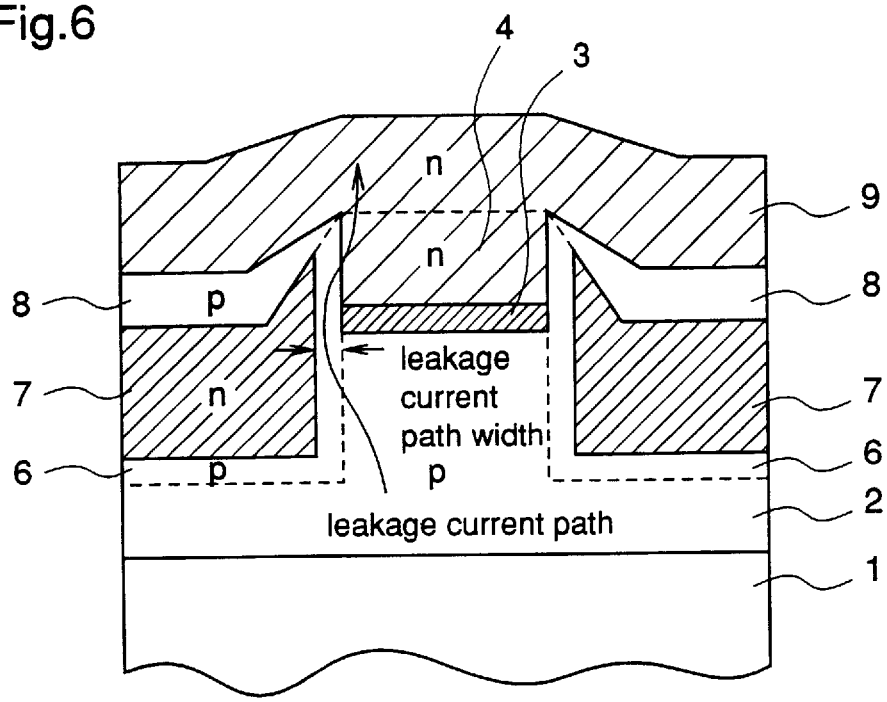
FIG. 6 is a diagram for explaining a leakage current path width in the semiconductor laser according to the first embodiment of the invention.

According to the first embodiment of the invention, the carrier concentration of the n type InP current blocking layer 7 is 7×10$^{18}$ cm$^{-3}$, the thickness D of the n type InP current blocking layer 7 grown on the (001) surface is 1.2 μm and is smaller than or equal to $D_n$. Therefore, the n type InP current blocking layer 7 is not grown on the (111)B surface of the p type InP mesa burying layer 6, so that contact of the n type InP current blocking layer 7 and the n type InP first cladding layer 4 is avoided. As shown in FIG. 6, the p type InP mesa burying layer 6 formed on the side surface of the mesa 21 becomes a path of leakage current that does not contribute to the laser oscillation, and the leakage current path width shown in FIG. 6 depends on the thickness of the p type InP mesa burying layer 6 adjacent opposite sides of the mesa. Because the mesa is formed by dry etching, the side surface of the mesa is made almost perpendicular to the substrate surface with good reproducibility, so that thickness control of the p type InP mesa burying layer 6 grown on the mesa side surface is facilitated. Consequently, the leakage current path width is narrowed with good controllability and contact of the n type InP layers is avoided as described above, whereby a semiconductor laser having reduced leakage current and superior laser characteristics can be fabricated. In addition, although the mesa stripe extending along the <110> direction is formed, it is possible to form the mesa stripe in an appropriate direction other than <110> direction because the mesa formation is performed by dry etching, so that an optical waveguide comprising the mesa is formed in an appropriate direction. Because dry etching is used for the mesa formation, it is possible to form a finer mesa than when the wet etching is used therefor. Consequently, an optical integrated device having superior characteristics can be fabricated with good controllability.

When the carrier concentration of the n type InP current blocking layer 7 is not 7×10$^{18}$ cm$^{-3}$ but is, for example, 4×10$^{18}$ cm$^{-3}$, the thickness D of the current blocking layer 7 grown on the (001) surface should be 1.0 μm. In this case, the angle θ is 20° and $D_n$ that is obtained from the above-described formula is 1.002 μm. Therefore, since D is smaller than or equal to $D_n$, contact of the n type InP current blocking layer 7 and the n type InP first cladding layer 4 is prevented.

In addition, when the carrier of the n type InP current blocking layer 7 is, for example, 1×10$^{18}$ cm$^{-3}$, the thickness D of the current blocking layer 7 grown on the (001) surface should be 0.6 μm. In this case, the angle θ is 40° and $D_n$ that is obtained from the above-described formula is 0.694 μm. Therefore, since D is smaller than or equal to $D_n$, contact of the n type InP current blocking layer 7 and the n type InP first cladding layer 4 is prevented.

Embodiment 2

A description is given of a semiconductor laser and a method of fabricating the semiconductor laser according to a second embodiment of the present invention.

Figure 7:
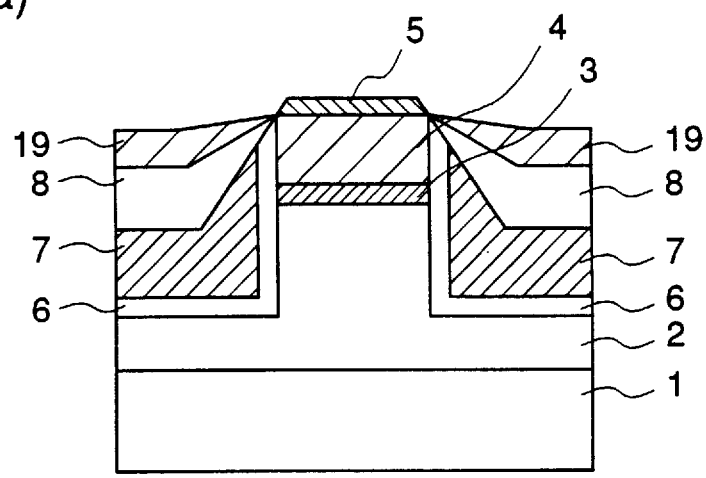
FIGS. 7(a) and 7(b) are cross-sectional views illustrating process steps in a method of fabricating a semiconductor laser and a semiconductor laser that is fabricated by the method in accordance with a second embodiment of the present invention.
Figure 7:
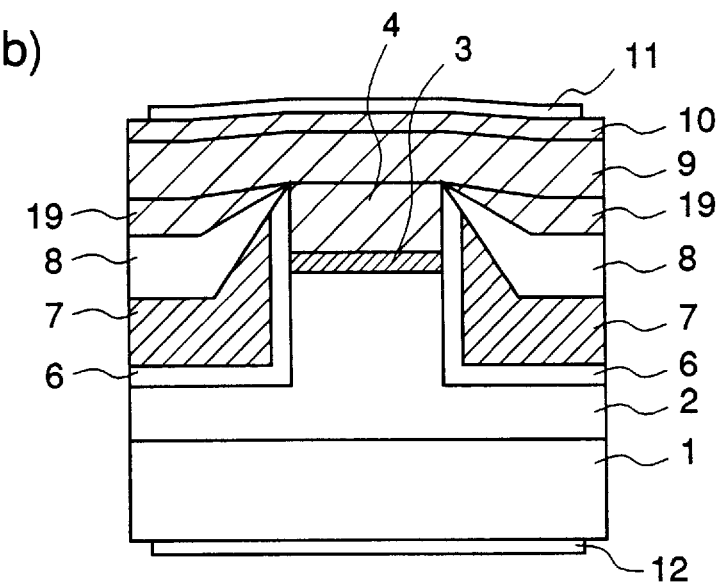

FIGS. 7(a) and 7(b) are cross-sectional views illustrating process steps in a method of fabricating a semiconductor laser and a semiconductor laser that is fabricated by the method. The same reference numerals as shown in FIGS. 5(a)–5(c) designate the same or corresponding parts, and the detailed description is not shown. In the method of fabricating a semiconductor laser according to the second embodiment of the invention, the process steps through the mesa formation are all the same as described in the first embodiment.

After the mesa formation, as shown in FIG. 7(a), using the $SiO_2$ film 5 as a mask, the p type InP mesa burying layer 6 having a carrier concentration of 8×10$^{17}$ cm$^{-3}$ and a thickness of 0.2 μm, the n type InP current blocking layer 7 having a carrier concentration of 1×10$^{18}$ cm$^{-3}$ and having a thickness of 0.6 μm on the (001) surface, the p type InP current blocking layer 8 having a carrier concentration of 8 ×10$^{17}$ cm$^{-3}$ and a thickness of 0.6 μm, and an n type InP covering layer 19 having a carrier concentration of 1×10$^{18}$ cm$^{-3}$ and a thickness of 0.4 μm are successively selectively grown by MOCVD on regions of the wafer that are not masked with the $SiO_2$ film 5. In this case, since the carrier concentration of the n type InP current blocking layer 7 is 1×10$^{18}$ cm$^{-3}$, the angle θ is 40°. Therefore, in order not to grow the n type InP current blocking layer 7 on the (111)B surface of the p type InP mesa burying layer 6, the critical thickness $D_n$ of the current blocking layer 7 grown on the (001) surface is 0.694 μm. Consequently, the thickness D of the n type InP current blocking layer 7 grown on the (001) surface is 0.6 μm, and this satisfies the relationship of D≦$D_n$. The semiconductor laser according to the second embodiment is different from that of the first embodiment in that the n type InP covering layer 19 is grown on the p type InP current blocking layer 8.

Then, as in the method of fabricating a semiconductor laser described in the first embodiment of the invention, after removing the SiO₂ film 5, the n type InP second cladding layer 9, the n type InP contact layer 10, the front electrode 11, and the rear electrode 12 are formed, followed by cleaving of the wafer and coating of the front and back facet reflection films, completing the semiconductor laser shown in FIG. 7(b).

According to the second embodiment of the invention, as described above, the thickness D of the n type InP current blocking layer 7 grown on the (001) surface is 0.6 μm and is smaller than or equal to $D_n$. Therefore, the contact of the n type InP current blocking layer 7 and the n type InP first cladding layer 4 is avoided, whereby a semiconductor laser having reduced leakage current and superior laser characteristics can be fabricated with good reproducibility. Further, after the removal of the SiO₂ film 5, the n type InP second cladding layer 9 is regrown on the n type InP covering layer 19. This regrowth interface is not a p-n Junction interface but an interface between the n type layers. Therefore, an increase in leakage current due to interface deterioration that is caused when the regrowth interface is a p-n junction interface is avoided, whereby reliability of the semiconductor laser is improved as compared with the semiconductor laser shown in FIG. 5(c) in which the n type InP second cladding layer 9 is grown on the p type InP current blocking layer 8.

Embodiment 3

In the semiconductor laser including grown mesa burying layers on opposite sides of a mesa formed by dry etching, superior laser characteristics are required. Actually, however, laser characteristics equivalent to those of the semiconductor laser including forming the mesa by wet etching are not achieved. According to B.-T. Lee, et al., IEEE PHOTONICS TECHNOLOGY LETTERS, Vol. 5, No. 3, March 1993, pp. 279–280 and Articles from Electronics Society Meetings of the Institute of Electronics, Information and Communication Engineers, C-292, pp. 292, physical damage of the mesa side surface due to the dry etching makes the laser characteristics of the semiconductor laser utilizing dry etching inferior to the laser characteristics of the semiconductor laser utilizing wet etching. The mesa side surface that is formed by the dry etching is further wet-etched by about 0.1 μm or more, whereby the laser characteristics of the semiconductor laser using the dry etching become equivalent to those of the semiconductor laser using the wet etching. However, when the wet etching is additionally performed after the dry etching, the mesa-stripe structure that is formed by the dry etching with good uniformity is transformed.

As a result of repeated diligent studies by the inventors, it is made clear that superior laser characteristics are not realized in the semiconductor laser including grown mesa burying layers on opposite sides of the mesa formed by the dry etching not because the physical damage of the mesa side surface due to the dry etching. Rather a striation of the mesa side surface produced when the mesa is formed, i.e., a striation of the mesa width adversely affects. The following is a detailed explanation of this striation.

Figure 8:
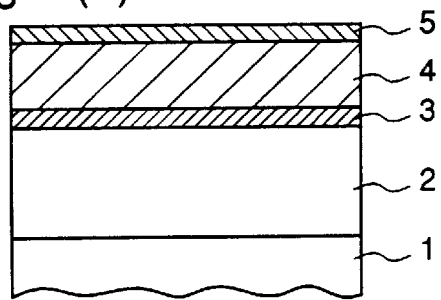
FIGS. 8(a)–8(e) are cross-sectional views and a perspective view illustrating process steps in forming an etching mask $SiO_2$ film for mesa formation using contact exposure.
Figure 8:
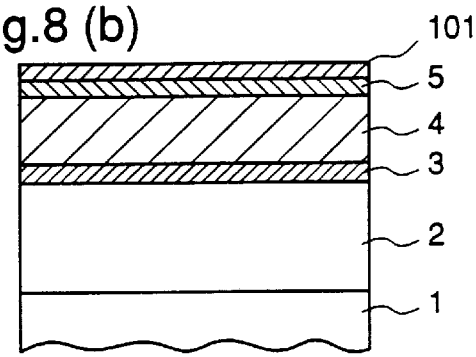
Figure 8:
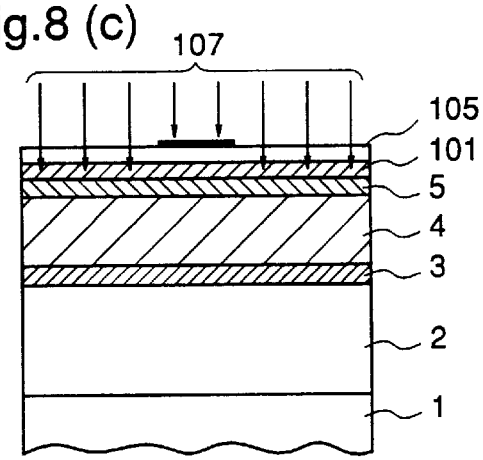
Figure 8:
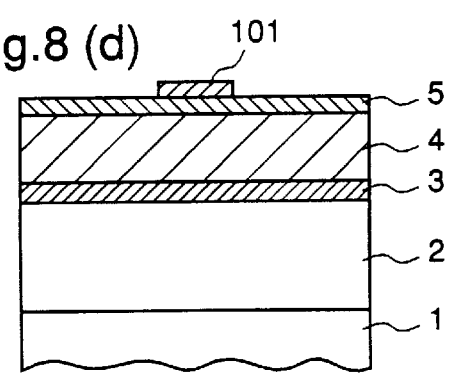
Figure 8:
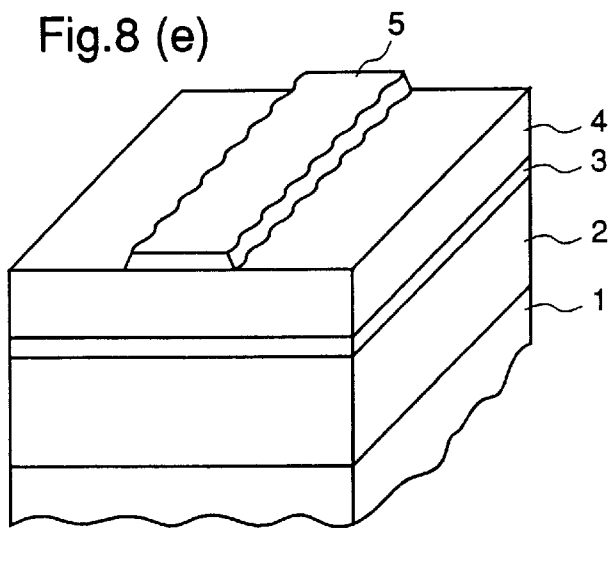

FIGS. 8(a)–8(e) are cross-sectional views and a perspective view illustrating process steps in forming an etching mask for mesa formation. Initially, as shown in FIG. 8(a), the p type InP buffer layer 2, the undoped InGaAsP active layer 3, and the n type InP first cladding layer 4 are successively grown on the p type InP substrate 1 to form semiconductor grown layers, and the SiO₂ film 5 is deposited over the entire surface of the first cladding layer 4. Next, as shown in FIG. 8(b), the entire surface of the SiO₂ film 5 is coated with a photoresist 101. In the step of FIG. 8(c), a photo mask 105 is closely adhered to the surface of the photoresist 101, and exposure light 107 irradiates the wafer from the above. Further, after photo mask 105 is separated from the photoresist 101, develoment is performed to form a stripe-shaped resist pattern 101 (FIG. 8(d)). Then, using the resist pattern 101 as a mask, the SiO₂ film 5 is plasma-etched and the resist pattern 101 is removed to form the stripe-shaped SiO₂ film 5 serving as an etching mask for the mesa formation and as a mask for the selective growth of the mesa burying layers. As described above, when contact exposure is used for forming the resist pattern 101, in order to form a stripe-shaped resist pattern having a width of 2 μm, the pattern width of the photo mask 105 must be 2 μm, i.e., the value equal to the width of the resist pattern. In addition, in order to avoid overexposure and underexposure, the thickness of the resist 101 should be thin, i.e., about 0.1 μm. In a case where the resist 101 is thin, RIE cannot be employed for etching the SiO₂ film 5 using the resist 101 as a mask. Therefore, this etching is performed by plasma etching. However, when the plasma etching is performed, the side surface of the stripe-shaped SiO₂ film 5 has a random striation that is not the shape of the resist pattern 101.

Figure 9:
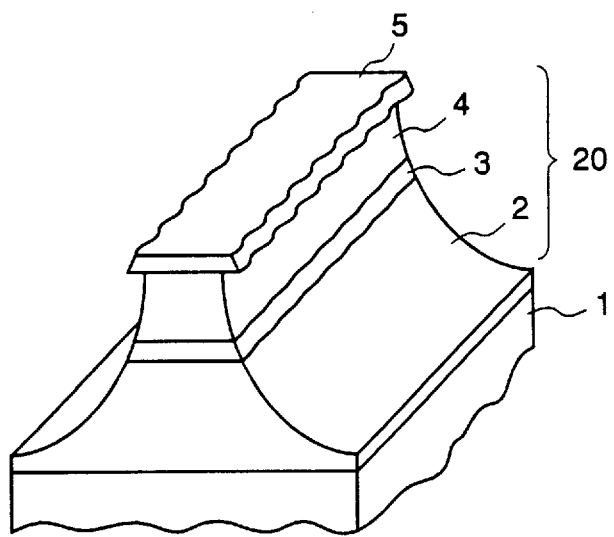
FIGS. 9(a) and 9(b) are a perspective view and a top view illustrating a mesa structure formed by wet etching.
Figure 9:
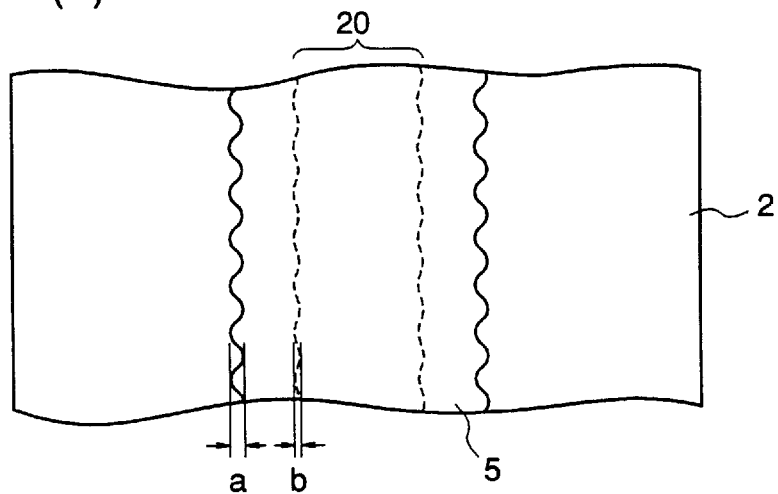

After forming the stripe-shaped SiO₂ film 5, as shown in FIG. 9(a), when the semiconductor grown layers are wet-etched using the stripe-shaped SiO₂ film 5 as a mask to form the mesa structure 20, the striation width b of the mesa side surface is smaller than the striation width a of the side surface of the SiO₂ film 5 (FIG. 9(b)). This is because wet etching is chemical etching so that a surface which is hard to etch may remain. Since the mesa side surface is formed by this wet etching, even if the striation is present at the side surface of the mask pattern, unevenness of the mesa side surface becomes gentler than that of the side surface of the mask pattern. In this case, however, as described above, it is difficult to precisely control the leakage current path width and to form the narrow mesa structure.

Figure 10:
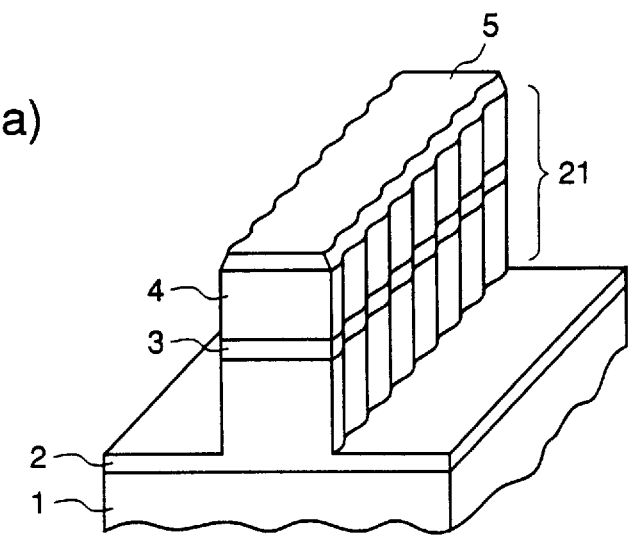
FIGS. 10(a) and 10(b) are a perspective view and a top view illustrating a mesa structure formed by dry etching, especially by RIE.
Figure 10:
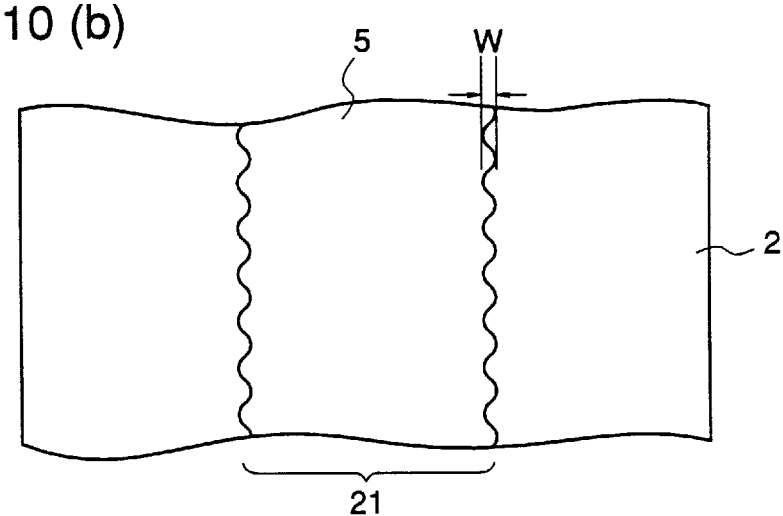

Meanwhile, as shown in FIG. 10(a), when the mesa structure 21 is formed by RIE, the side surface of the mesa structure 21 completely reflects the shape of the side surface of the SiO₂ film 5 as an etching mask. This is because RIE is physical etching so that the etched surface may be taken off and a specific crystal surface is not exposed to the etched surface. Therefore, the striation width of the mesa side surface W is almost equal to the striation width of the side surface of the stripe-shaped SiO₂ film 5 (FIG. 10(b)).

Figure 11:
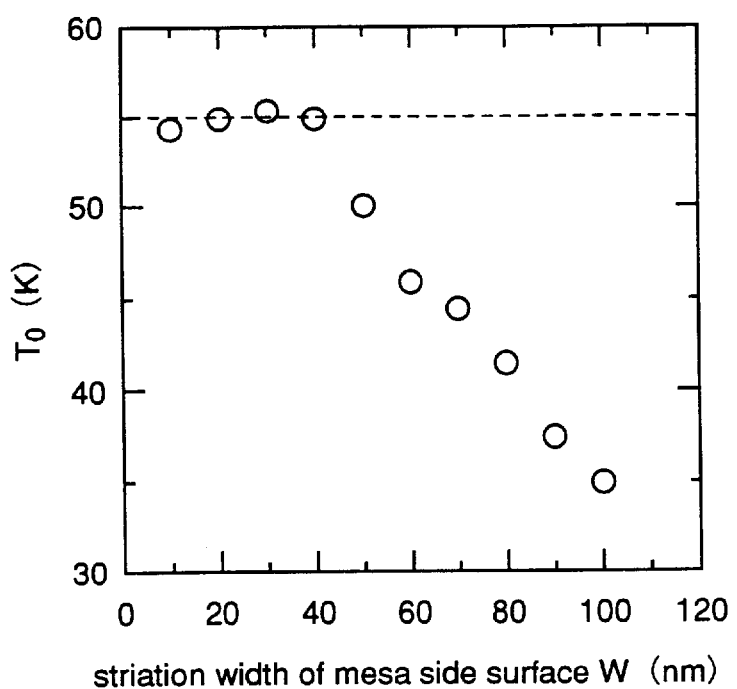
FIG. 11 is a graph showing a relation between the striation width W of a mesa side surface and the characteristic temperature To of the laser.

FIG. 11 is a graph showing a relation between the striation width W of the mesa side surface that is formed by RIE and the characteristic temperature $T_0$ of the laser. Generally, temperature dependency of threshold current density $J_{th}$ of a laser is represented by $$J_{th} = J_{th0} \exp(T/T_0)$$

where $J_{th0}$ is the proportional it constant and $T_0$ is the characteristic temperature of the laser. That is, the characteristic temperature $T_0$ indicates how high the temperature at which the laser can keep its characteristics equivalent to those at room temperature is, and the laser characteristics at high temperature improve as $T_0$ increases. A broken line shown in the figure shows a model value of characteristic temperature $T_0$ in a laser having a mesa structure that is formed by wet etching. As is known from the figure, when the striation width W of the mesa side surface is smaller than or equal to 40 nm, the characteristic temperature $T_0$ is equivalent to that of the laser having the mesa formed by wet etching. However, as W increases above 40 nm, $T_0$ becauses lower. Consequently, the laser characteristics at high temperature are deteriorated when the striation width W is larger than 40 nm.

In a semiconductor laser, deterioration of laser characteristics at high temperature is caused by an increase in current flowing outside an active layer, i.e., leakage current. Even if the etching mask is formed in a direction in which the mesa side surface becomes a (1$\bar{1}$0) surface, when the striation of the mesa side surface is large, early growth of the p type InP mesa burying layer adjacent opposite sides of the mesa is performed in a direction that slightly inclines from the (1$\bar{1}$0) surface. Thereby, the carrier concentration at the grown portion and the growth thickness are different from design values, respectively. As described above, when the striation width W of the mesa side surface is large, the crystal constituting the mesa burying layer serving as the leakage current path on opposite sides of the active layer becomes undersirable, whereby the crystalline quality becomes poor. Therefore, the leakage current flow is probable and the threshold current density is high. This is why the characteristic temperature $T_0$ goes down with an increase in the striation width W of the mesa side surface as shown in FIG. 11.

Accordingly, in order to prevent the deterioration of the laser characteristics at high temperature, it is required to reduce the striation width of the mesa side surface. As described above, when RIE is used for the mesa formation, since the mesa side surface reflects the shape of the side surface of the SiO$_2$ film 5 as an etching mask, the striation width of the side surface of the stripe-shaped SiO$_2$ film 5 should be reduced. However, since contact exposure is used for the exposure of the photoresist 101 serving as an etching mask of the SiO$_2$ film 5, it is necessary that the thickness of the resist 101 be thin, about 0.1 μm, so that this etching must be performed by plasma etching. In this plasma etching, a random striation is produced on the side surface of the stripe-shaped SiO$_2$ film 5. Consequently, the striation width W of the mesa side surface cannot be smaller than or equal to 40 nm and the characteristic temperature $T_0$ of the laser is lower than that of a semiconductor laser in which the mesa is formed by wet etching.

According to the third embodiment of the invention, by reducing the striation width of the mesa side surface, the mesa structure is satisfactorily buried after dry etching, resulting in superior device characteristics and a very effective measure for realizing an optical integrated device.

A description is given of a semiconductor laser and a method of fabricating the semiconductor laser according to a third embodiment of the present invention.

FIGS. 12(a)–12(f) are cross-sectional views and perspective views illustrating process steps in a method of fabricating a semiconductor laser and a semiconductor laser that is fabricated by the above-described method.

Initially, as in the first embodiment of the invention, on the p type InP wafer 1 with a (001) surface at its front surface, the p type InP buffer layer 2 having a carrier concentration of 1×10$^{18}$ cm$^{-3}$ and a thickness of 1.8 μm, the undoped InGaAsP active layer 3 having a thickness of 0.1 μm a band gap energy corresponding to a wavelength of 1.3 μm, and the n type InP first cladding layer 4 having a carrier concentration of 1×10$^{18}$ cm$^{-3}$ and a thickness of 0.7 μm are successively grown, preferably by MOCVD or gas source MBE, to form semiconductor grown layers having a double heterojunction structure. The active layer 3 may not be an InGaAsP single layer but a layer having a multi quantum-well structure. Further, the SiO$_2$ film 5 having a thickness of 200 nm is deposited on the entire surface of the n type InP first cladding layer 4, preferably by sputtering or CVD.

Figure 12:
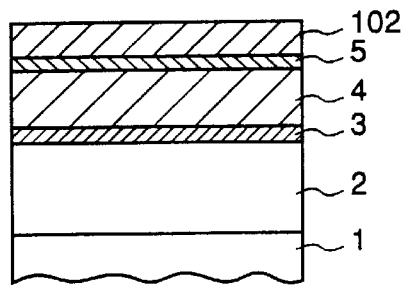
FIGS. 12(a)–12(f) are cross-sectional views and perspective views illustrating process steps in a method of fabricating a semiconductor laser and a semiconductor laser that is fabricated by the method in accordance with a third embodiment of the present invention.
Figure 12:
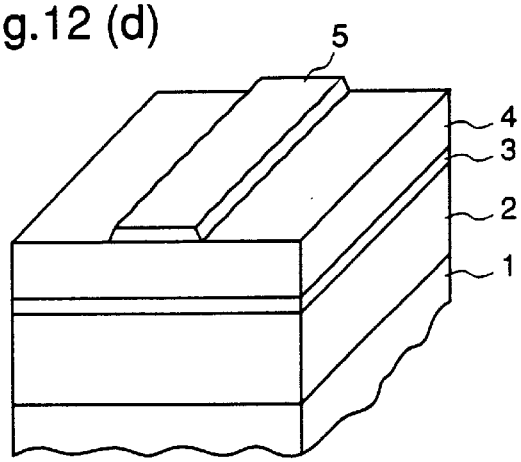
Figure 12:
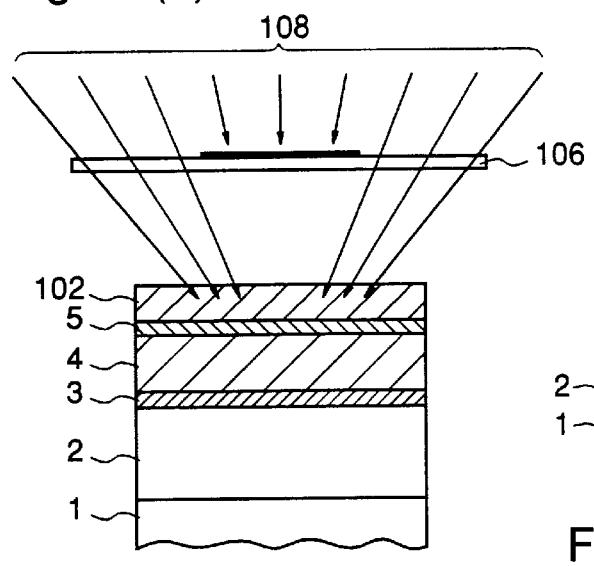
Figure 12:
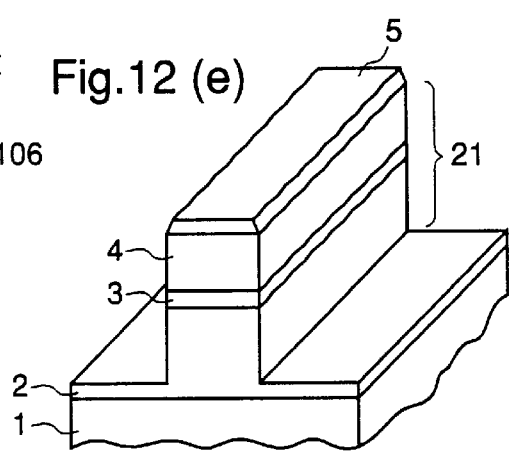
Figure 12:
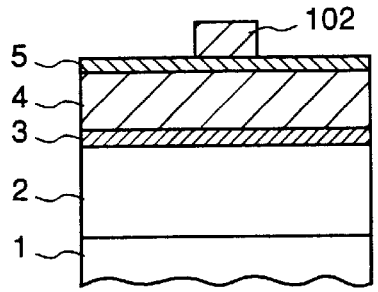
Figure 12:
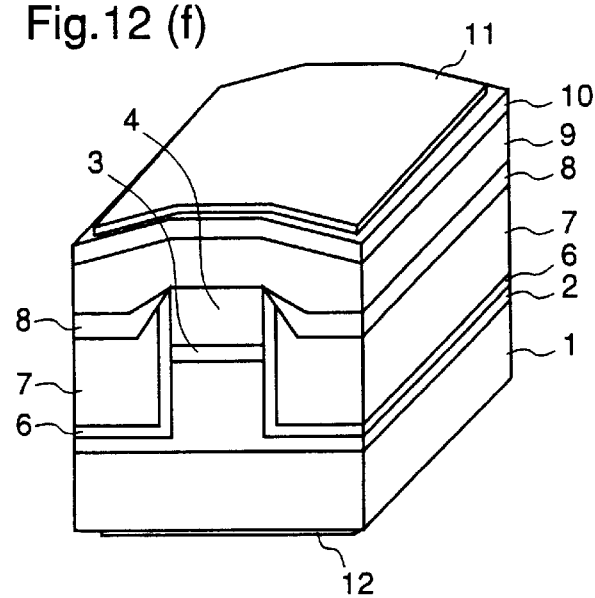

Next, as shown in FIG. 12(a), the entire surface of the SiO$_2$ film 5 is coated with a photoresist 102. As described later, since reduced projection exposure is used the, a thickness of the photoresist 102 is made larger than the resist thickness of 0.1 μm that is used when contact exposure is performed, i.e., about 0.5 μm.

In the step of FIG. 12(b), reduced projection exposure is carried out using a photo mask (reticle) 106. In the figure, reference numeral 108 designates light used for the exposure. In a case where the reduction ratio of the exposure is 5:1, assuming that a width of a stripe-shaped resist pattern to be formed is 1.5 μm, the pattern width on the photo mask 106 may be 7.5 μm. Therefore, unlike contact exposure in which the pattern width on the photo mask must be the same as the width of the resist pattern, even when the photoresist is thick, the most suitable exposure is easily performed.

Thereafter, development is performed to form a stripe-shaped resist pattern 102 extending along a <110> direction (FIG. 12(c)).

Then, using the resist pattern 102 as a mask, the SiO$_2$ film 5 is etched by RIE and the resist 102 is removed to form the stripe-shaped SiO$_2$ film 5 as shown in FIG. 12(d). Because this resist 102 is thick, 0.5 μm, it is possible to use the resist as a mask for RIE. In this case, the striation of the side surface of the stripe-shaped SiO$_2$ film is smaller than when the SiO$_2$ film is plasma-etched using the resist pattern formed by contact exposure as a mask.

Using this SiO$_2$ film 5 as a mask, the semiconductor grown layers are subjected to RIE, preferably using C$_2$H$_6$+H$_2$ to form the mesa structure 21 extending along the <110> direction as shown in FIG. 12(e). For example, a height $H_m$ of the mesa, i.e., an etching depth, is set to 2.0 μm. In the etching, the upper surface of the p type InP buffer layer 2 that remains on opposite sides of the mesa becomes a (001) surface, and the mesa side surface almost becomes a (1$\bar{1}$0) surface. Since the etching for the mesa formation is not plasma etching but RIE, the striation of the mesa side surface reflects the striation of the side surface of the stripe-shaped SiO$_2$ film 5. As described above, this striation at the side of the SiO$_2$ film 5 is small. Therefore, the striation width of the mesa side surface is suppressed to 40 nm or less. The gas used for RIE may be CH$_4$+H$_2$ or CH$_4$+H$_2$+O$_2$.

The subsequent processes are the same as the processes from the mesa burying layer forming process described in the first embodiment. That is, as shown in FIG. 5(b), using the SiO$_2$ film 5 as a mask, the p type InP mesa burying layer 6 having a carrier concentration of 8×10$^{17}$ cm$^{-3}$ and a thickness of 0.2 μm, the n type InP current blocking layer 7 having a carrier concentration of 7×10$^{18}$ cm$^{-3}$ and having a thickness of 1.2 μm on the (001) surface, and the p type InP current blocking layer 8 having a carrier concentration of 8×10$^{17}$ cm$^{-3}$ and a thickness of 0.6 μm are successively selectively grown by MOCVD on regions of the wafer that are not masked with the SiO$_2$ film 5. In this growth, the (001) surface and the (1$\bar{1}$0) surface form the surface of the p type InP mesa burying layer 6 after the growth, and the n type InP current blocking layer 7 is grown on these surfaces as shown in FIG. 1(b). Because the carrier concentration of the n type InP current blocking layer 7 is 7×10$^{18}$ cm$^{-3}$, it is known from FIG. 2 that an angle θ, which is formed between the (1$\bar{1}$0) surface and a plane surface including a line where the (001) surface and the (1$\bar{1}$0) surface as the grown surfaces of the n type InP current blocking layer 7 are adjacent to each other and a line where the (001) surface and the (1$\bar{1}$0) surface as the surfaces of the p type InP mesa burying layer 6 are adjacent to each other, is 10°. When the growth rates of the n type InP mesa burying layer 7 on the (1$\bar{1}$0) surface and on the (001) surface are respectively $R_g(1\bar{1}0)$ and $R_g(001)$, the angle θ is represented by tan θ=$R_g(110)/R_g$ (001). Therefore, in order not to grow the n type InP current blocking layer 7 on the (111)B surface of the p type InP mesa burying layer 6, the critical thickness $D_n$ of the current blocking layer 7 grown on the (001) surface is 1.214 µm, which is obtained from the above-described formula $$D_n = \frac{H_m - D_p \cdot (1 + \tan \theta_{111})}{1 + \tan \theta \cdot \tan \theta_{111}} = \frac{H_m - (1 + \sqrt{2}) D_p}{1 + \sqrt{2} \tan \theta}$$

where $D_p$ is the thickness of the p type InP mesa burying layer 6 and $\theta_{111}$ is an angle formed between the (111)B surface and the (001) surface. The value of $\tan \theta_{111}$ is $\sqrt{2}$. Consequently, the thickness D of the n type InP current blocking layer 7 grown on the (001) surface is 1.2 µm, and this satisfies the relationship of $D \leq D_n$. Then, after removing the SiO$_2$ film 5 using an HF system etchant, the n type InP second cladding layer 9 having a carrier concentration of $1 \times 10^{18}$ cm$^{-3}$ and a thickness of 1.5 µm and the n type InP contact layer 10 having a carrier concentration of $7 \times 10^{18}$ cm$^{-3}$ and a thickness of 0.5 µm are successively grown over the entire surface of the wafer, preferably by MOCVD or gas source MBE as shown in FIG. 5(c). Thereafter, the front electrode 11 comprising Cr/Au and having a thickness of 200 nm is formed on the surface of then type InP contact layer 10, preferably by sputtering. The rear electrode 12 comprising AuZn and having a thickness of 100 nm is formed on the rear surface of the p type InP substrate 1, preferably by EB evaporation method. Then, the wafer is cleaved to separate semiconductor laser chips each having a cavity length of about 300 µm (100~1000 µm), from each other. Finally, a front facet of each chip is coated with the front facet reflection film comprising an Al$_2$O$_3$ film and having a thickness of about 400 nm and a reflectivity of 30% and a back facet is coated with the back facet reflection film comprising SiO$_2$, Si, SiO$_2$, and Al$_2$O$_3$ layers, respectively having thicknesses of about 220, 100, 220, and 400 nm, which layers are successively laminated and having a reflectivity of 60%, preferably by EB evaporation, completing the semiconductor laser shown in FIG. 12(f).

According to the third embodiment of the invention, the striation width W of the side surface of the stripe-shaped mesa structure 21 is smaller than or equal to 40 nm. Since the striation at the mesa side surface is small and the p type InP mesa burying layer 6 adjacent the mesa side surface is grown almost on the (1$\bar{1}$0) surface, the carrier concentration at the grown portion and the growth thickness become values that approximate design values, respectively, whereby crystalline quality of the mesa burying layer 6 is good. Therefore, the mesa burying layer 6 serving as a leakage current path on opposite sides of the active layer 3 is as designed and the leakage current flowing through the mesa burying layer 6 is suppressed. Consequently, a laser having superior temperature characteristics, in which threshold current density at room temperature is reduced, increase in leakage current at high temperature is suppressed, and deterioration of laser characteristics at high temperature is prevented, can be achieved.

In addition, as in the first embodiment of the invention, since the carrier concentration of the n type InP current blocking layer 7 is $7 \times 10^{18}$ cm$^{-3}$, and the thickness D of the n type InP current blocking layer 7 grown on the (001) surface is 1.2 µm, it is smaller than or equal to $D_n$. Therefore, the n type InP current blocking layer 7 is not grown on the (111)B surface of the p type InP mesa burying layer 6, so that contact of the n type InP current blocking layer 7 and the n type InP first cladding layer 4 is avoided. Because the mesa structure 21 is formed by RIE, the side surface of the mesa becomes almost perpendicular to the substrate surface with good reproducibility, so that thickness control of the p type InP mesa burying layer 6 grown on the mesa side surface is facilitated. Consequently, the leakage current path width is narrowed with good controllability and contact of the n type InP layers is avoided as described above, whereby a semiconductor laser having reduced leakage current and superior laser characteristics can be fabricated. In addition, although a mesa stripe extending along the <110> direction is formed, it is possible to form the mesa stripe in an appropriate direction except the <110> direction because the mesa formation is performed by dry etching, so that an optical waveguide comprising the mesa is formed in an appropriate direction. Because dry etching is used for the mesa formation, it is possible to form a finer mesa than when the wet etching is used therefor. Consequently, an optical integrated device having superior characteristics can be fabricated with good controllability.

When the carrier concentration of the n type InP current blocking layer is not $7 \times 10^{18}$ cm$^-$example, $4 \times 10^{18}$ cm$^{-3}$, the thickness D of the current blocking layer 7 grown on the (001) surface should be 1.0 µm. In this case, the angle θ is 20° and $D_n$ that is obtained from the above-described formula is 1.002 µm. Therefore, since D is smaller than or equal to $D_n$, contact of the n type InP current blocking layer 7 and the n type InP first cladding layer 4 is prevented.

In addition, when the carrier concentration of the n type InP current blocking layer 7 is, for example, $1 \times 10^{18}$ cm$^{31\ 3}$, the thickness D of the current blocking layer 7 grown on the (001) surface should be 0.6 µm. In this case, the angle θ is 40° and $D_n$ that is obtained from the above-described formula is 0.694 µm. Therefore, since D is smaller than or equal to $D_n$, the contact of the n type InP current blocking layer 7 and the n type InP first cladding layer 4 is prevented.

Embodiment 4

A description is given of a semiconductor laser and a method of fabricating the semiconductor laser according to a fourth embodiment of the present invention.

In this fabricating method, the process steps through the mesa formation are the same as shown in FIGS. 12(a)–12(e) described for the third embodiment, and the subsequent processes are the same as the processes shown in FIGS. 7(a) and 7(b) described for the second embodiment.

That is, the mesa structure 21 is formed as shown in FIGS. 12(a)–12(e). The striation width of the side surface of the mesa 21 is smaller than or equal to 40 nm. Thereafter, as shown in FIG. 7(a), using the SiO$_2$ film 5 as a mask, the p type InP mesa burying layer 6 having a carrier concentration of $8 \times 10^{17}$ cm$^{-3}$ and a thickness of 0.2 µm, the n type InP current blocking layer 7 having a carrier concentration of $1 \times 10^{18}$ cm$^3$ and having a thickness of 0.6 µm on the (001) surface, the p type InP current blocking layer 8 having a carrier concentration of $8 \times 10^{17}$ cm$^{-3}$ and a thickness of 0.6 µm, and the n type InP covering layer 19 having a carrier concentration of $1 \times 10^{18}$ cm$^{-3}$ and a thickness of 0.4 µm are successively selectively grown by MOCVD on regions of the wafer that are not masked with the SiO$_2$ film 5. In this case, since the carrier concentration of the n type InP current blocking layer 7 is $1 \times 10^{18}$ cm$^3$, the angle θ is 40°. Therefore, in order not to grow the n type InP current blocking layer 7 on the (111)B surface of the p type InP mesa burying layer 6, the critical thickness $D_n$ of the current blocking layer 7 grown on the (001) surface is 0.694 µm. Consequently, the thickness D of the n type InP current blocking layer 7 grown on the (001) surface is 0.6 µm, and this satisfies the relationship of $D \leq D_n$ as in the first embodiment. The semiconductor laser according to the fourth embodiment is different from that shown in FIG. 12(f) in that the n type InP covering layer 19 is grown on the p type InP current blocking layer 8.

Figure 13:
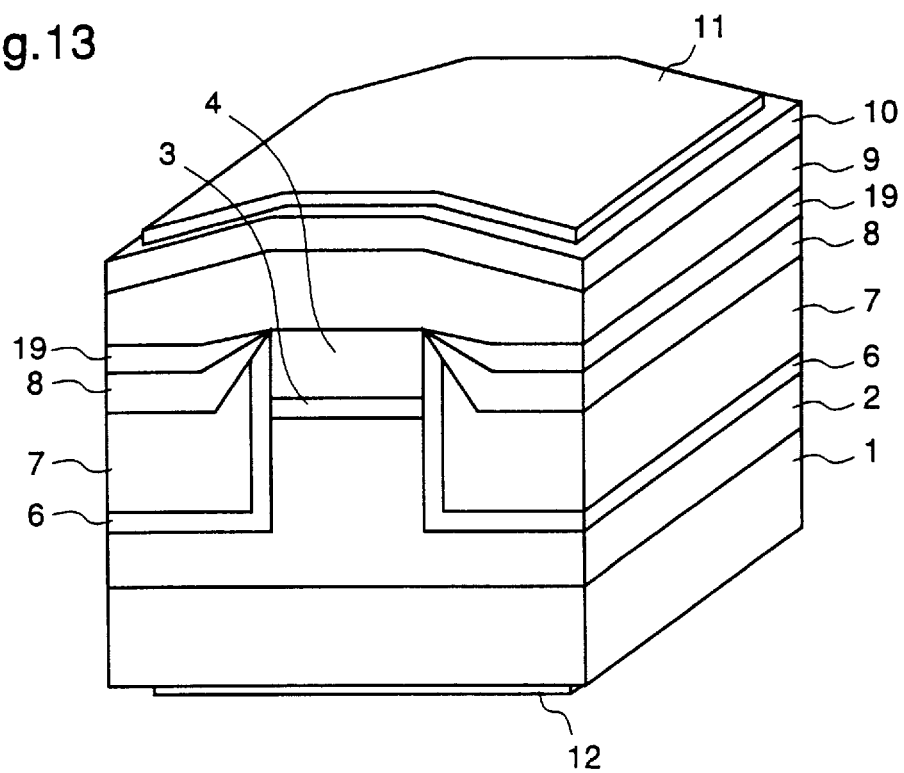
FIG. 13 is a perspective view illustrating a semiconductor laser in accordance with a fourth embodiment of the present invention.
Figure 14:
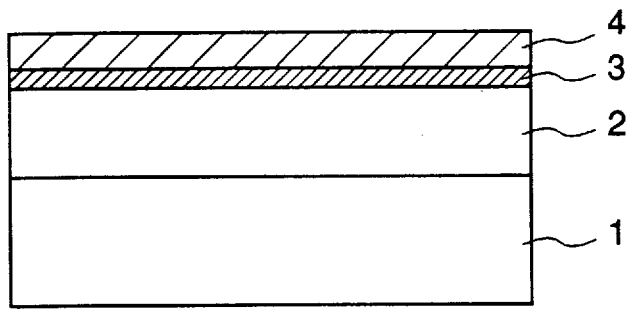
FIGS. 14(a)–14(d) are cross-sectional views illustrating process steps in a method of fabricating a prior art semiconductor laser.
Figure 14:
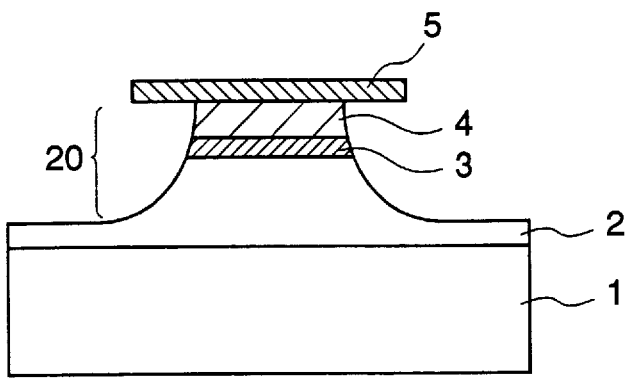
Figure 14:
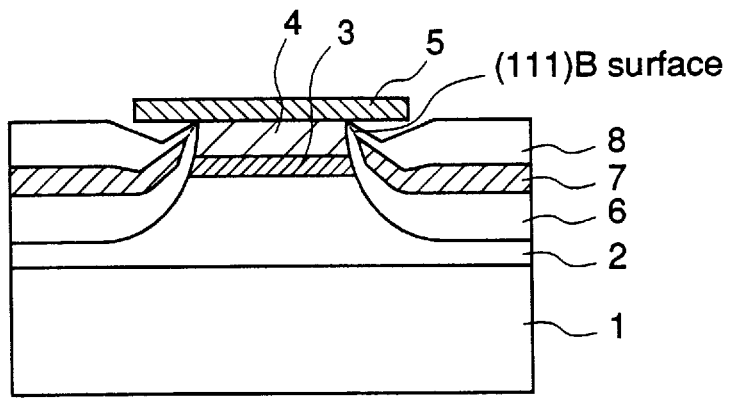
Figure 14:
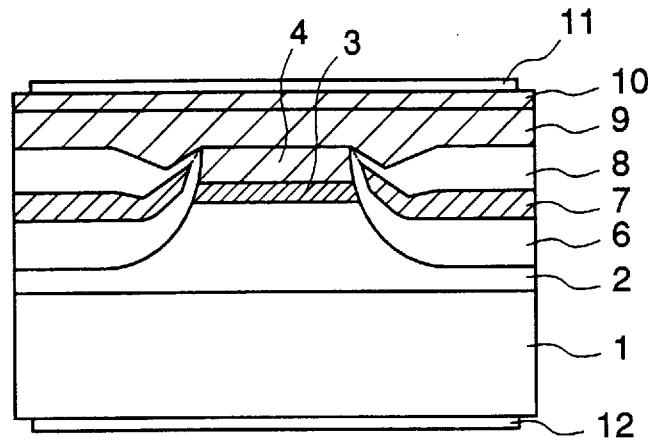
Figure 15:
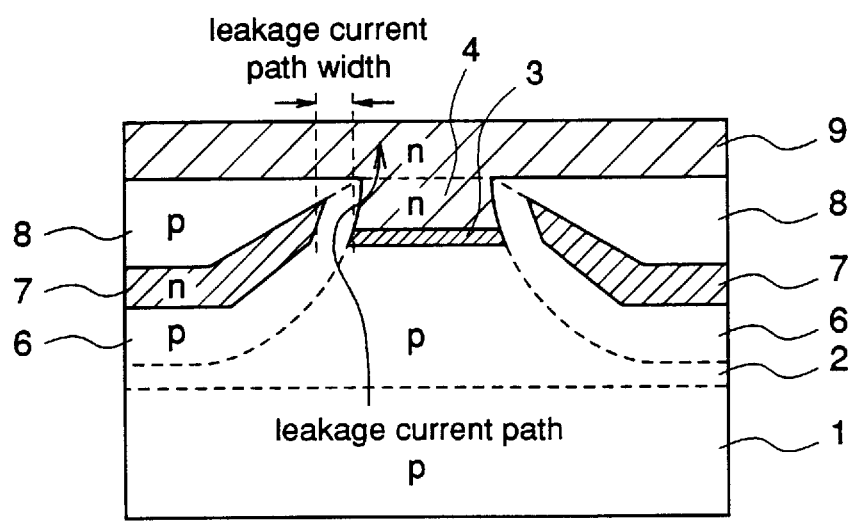
FIG. 15 is a diagram for explaining a leakage current path width in a prior art semiconductor laser.
Figure 16:
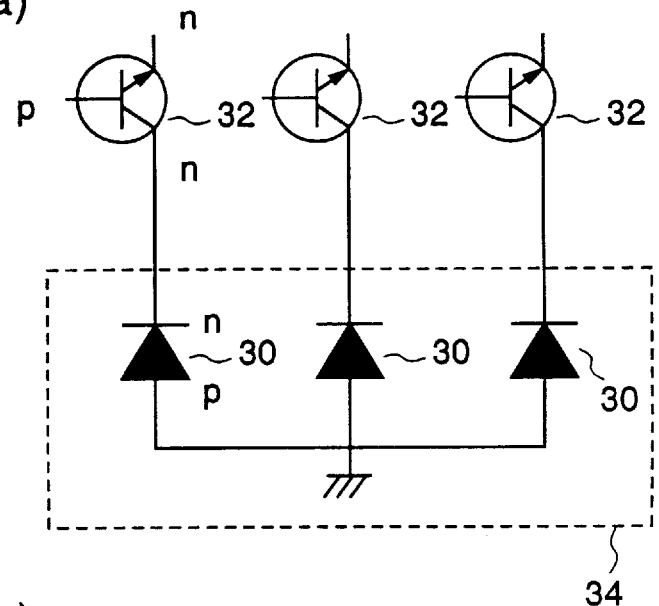
FIGS. 16(a) and 16(b) are circuits each for driving a laser array.
Figure 16:
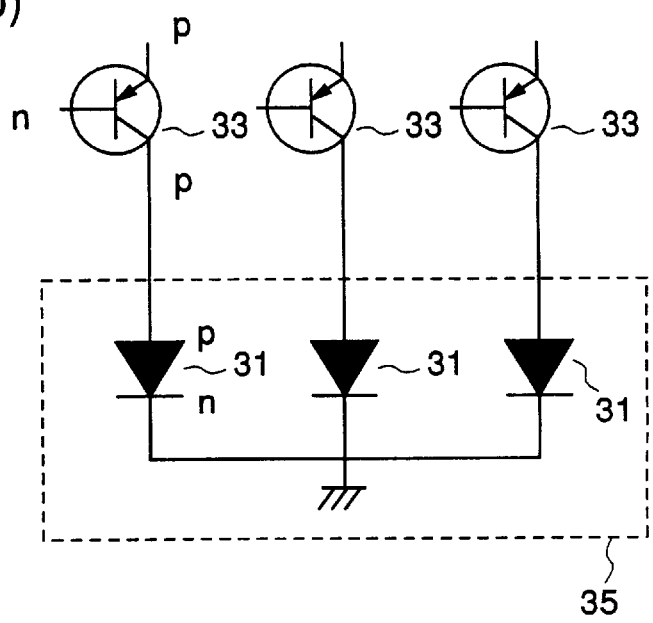

Then, as in the method of fabricating a semiconductor laser described in the first embodiment of the invention, after removing the SiO$_2$ film 5, the n type InP second cladding layer 9, the n type InP contact layer 10, the front electrode 11, and the rear electrode 12 are formed, followed by cleaving of the wafer and coating of the front and back facet reflection films, completing the semiconductor laser shown in FIG. 13.

According to the fourth embodiment of the invention, since the striation width W of the side surface of the mesa structure 21 is smaller than or equal to 40 nm, the mesa burying layer 6 serving as a leakage current path on opposite sides of the active layer 3 is as designed. Consequently, a laser having superior temperature characteristics, in which leakage current at room temperature is suppressed, threshold current is reduced, and an increase in leakage current at high temperature is suppressed, can be achieved. Further, as described above, the thickness D of the n type InP current blocking layer 7 grown on the (001) surface is 0.6 μm and it is smaller than or equal to D$_n$. Therefore, the contact of the n type InP current blocking layer 7 and the n type InP first cladding layer 4 is avoided, whereby a semiconductor laser having reduced leakage current and superior laser characteristics can be fabricated with good reproducibility. Furthermore, after the removal of the SiO$_2$ film 5, the n type InP second cladding layer 9 is regrown on the n type InP covering layer 19. This regrowth interface is not a p-n junction interface but an interface between the n type layers. Therefore, an increase in leakage current due to interface deterioration that is caused when the regrowth interface is a p-n junction is avoided, whereby reliability of the semiconductor laser is improved as compared with the semiconductor laser in which the n type InP second cladding layer 9 is grown on the p type InP current blocking layer 8.

What is claimed is:

1. A semiconductor device including:

a p type InP substrate with a (001) surface;

a mesa structure formed by dry etching, including a stripe-shaped region extending along a <110> direction, of epitaxial semiconductor layers disposed on the p type InP substrate, the mesa structure having (1$\bar{1}$0) side surfaces at opposite sides and a height H$_m$; and epitaxial mesa burying layers including a p type InP burying layer on the (1$\bar{1}$0) side surfaces of the mesa structure and on the (001) surface at an upper surface of the epitaxial semiconductor layers at opposite sides of the mesa structure, the p type InP burying layer having a thickness D$_p$, an n type InP epitaxial burying layer on side and upper surfaces of the p type InP burying layer, wherein an angle formed between a (111)B surface and the (001) surface is θ$_{111}$, growth rates of the n type InP burying layer on the (1$\bar{1}$0) side surfaces and on the (001) surface are, respectively, R$_g$(1$\bar{1}$0) and R$_g$(001) an angle θ is determined by tan θ=R$_g$(1$\bar{1}$0)/R$_g$(001) and a critical thickness D$_n$ of the n type InP burying layer on the (001) surface when the n type InP burying layer is not disposed on the (111)B surface of the p type InP burying layer is $$D_n = \frac{H_m - D_p \cdot (1 + \tan\theta_{111})}{1 + \tan\theta \cdot \tan\theta_{111}} = \frac{H_m - (1 + \sqrt{2})D_p}{1 + \sqrt{2}\,\tan\theta}$$

the n type InP burying layer on the (001) surface having a thickness D≦D$_n$.

2. The semiconductor device of claim 1 wherein the epitaxial semiconductor layers include an active layer emitting laser light and an n type first cladding layer on the active layer, and the n type InP burying layer is an n type InP current blocking layer, the semiconductor device including an epitaxial p type InP current blocking layer on the n type InP current blocking layer.

3. The semiconductor device of claim 2 wherein:

the mesa burying layers include an n type InP covering layer on the p type InP current blocking layer; and the semiconductor device includes an n type InP second cladding layer and an n type InP epitaxial contact layer on the first cladding layer as an uppermost layer of the mesa and on the n type InP covering layer as an uppermost layer of the mesa burying layers.

4. A semiconductor device including:

a semiconductor substrate:

a mesa structure formed by dry etching epitaxial semiconductor layers including an active layer emitting laser light disposed on the semiconductor substrate; and mesa burying layers on opposite side surfaces of the mesa structure and at opposite sides of the mesa structure wherein a striation width W of the side surface of the stripe-shaped mesa is no longer than 40 nm.

5. The semiconductor device of claim 4 wherein:

the semiconductor substrate is a p type InP substrate with a (001) surface;

the mesa structure extends along a <110> direction of the epitaxial semiconductor layers on the p type InP substrate, the mesa structure has (1$\bar{1}$0) side surfaces and a height H$_m$; and the mesa burying layers include a p type InP epitaxial burying layer on the (1$\bar{1}$0) side surfaces of the mesa structure and on the (001) surface at opposite sides of the mesa structure, the p type InP burying layer having a thickness D$_p$, and an n type InP epitaxial burying layer on the p type InP burying layer wherein an angle between a (111)B surface and the (001) surface is θ$_{111}$, growth rates of the n type InP burying layer on the (1$\bar{1}$0) surfaces and on the (001) surface are, respectively, R$_g$(1$\bar{1}$0) and R$_g$(001), an angle θ is determined by θ=R$_g$(1$\bar{1}$0)/R$_g$(001), and the critical thickness D$_n$ of the n type InP burying layer on the (001) surface when the n type InP burying layer is not grown on the (111)B surface of the p type InP burying layer is $$D_n = \frac{H_m - D_p \cdot (1 + \tan\theta_{111})}{1 + \tan\theta \cdot \tan\theta_{111}} = \frac{H_m - (1 + \sqrt{2})D_p}{1 + \sqrt{2}\,\tan\theta}$$

the n type InP burying layer on the (001) surface having a thickness D≦D$_n$.

6. The semiconductor device of claim 5 wherein the epitaxial semiconductor layers include the active layer and an n type first cladding layer grown on the active layer, the n type InP burying layer of the mesa burying layers is an n type InP current blocking layer, and including a p type InP epitaxial current blocking layer on the n type InP current blocking layer.

7. The semiconductor device of claim 6 wherein:

the mesa burying layers include an n type epitaxial InP covering layer on the p type InP current blocking layer; and the semiconductor device includes an n type epitaxial second cladding layer and an n type epitaxial InP contact layer successively disposed on the first cladding layer as an uppermost layer of the mesa and the n type InP covering layer is an uppermost layer of the mesa burying layers.

* * * * *